(12) United States Patent
Wakamatsu et al.

(10) Patent No.: US 9,029,067 B2
(45) Date of Patent: May 12, 2015

(54) RESIN COMPOSITION FOR MAKING RESIST PATTERN INSOLUBLE, AND METHOD FOR FORMATION OF RESIST PATTERN BY USING THE SAME

(71) Applicant: JSR Corporation, Tokyo (JP)

(72) Inventors: Gouji Wakamatsu, Tokyo (JP); Masafumi Hori, Tokyo (JP); Kouichi Fujiwara, Tokyo (JP); Makoto Sugiura, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 14/487,894

(22) Filed: Sep. 16, 2014

(65) Prior Publication Data

US 2015/0004547 A1 Jan. 1, 2015

Related U.S. Application Data

(63) Continuation of application No. 13/004,898, filed on Jan. 12, 2011, now Pat. No. 8,877,429, which is a continuation of application No. PCT/JP2009/062710, filed on Jul. 14, 2009.

(30) Foreign Application Priority Data

Jul. 14, 2008 (JP) .................. 2008-183038

(51) Int. Cl.
*G03F 7/004* (2006.01)
*G03F 7/20* (2006.01)
(Continued)

(52) U.S. Cl.
CPC ................ *G03F 7/40* (2013.01); *G03F 7/0035* (2013.01); *G03F 7/0046* (2013.01); *G03F 7/0397* (2013.01); *H01L 21/0273* (2013.01); *G03F 7/2024* (2013.01)

(58) Field of Classification Search
CPC ....... G03F 7/004; G03F 7/0048; G03F 7/033; G03F 7/037; G03F 7/039; G03F 7/2024
USPC ........... 430/270.1, 280.1, 312, 325, 326, 327, 430/328, 330, 331
See application file for complete search history.

(56) References Cited

U.S. PATENT DOCUMENTS 8,211,624 B2 7/2012 Nakamura et al.
2009/0053657 A1 2/2009 Hatakeyama et al.
(Continued)

FOREIGN PATENT DOCUMENTS

JP 05-232704 9/1993
JP 07-003116 1/1995
(Continued)

OTHER PUBLICATIONS

Machine translation of JP 2005-338849, published on Dec. 8, 2005.*

(Continued)

Primary Examiner — Anca Eoff
(74) Attorney, Agent, or Firm — Oblon, McClelland, Maier & Neustadt, L.L.P.

(57) ABSTRACT

A resist pattern-insolubilizing resin composition is used in a resist pattern-forming method. The resist pattern-insolubilizing resin composition includes solvent and a resin. The resin includes a first repeating unit that includes a hydroxyl group in its side chain and at least one of a second repeating unit derived from a monomer shown by a following formula (1-1) and a third repeating unit derived from a monomer shown by a following formula (1-2), (1-1)

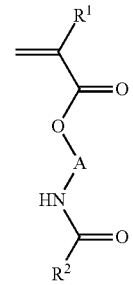

(1-2)

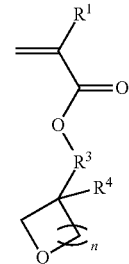

wherein for example, $R^1$ represents a hydrogen atom, A represents a methylene group, $R^2$ represents a group shown by a following formula (2-1) or a group shown by a following formula (2-2), $R^3$ represents a methylene group, $R^4$ represents a hydrogen atom, and n is 0 or 1, (2-1)

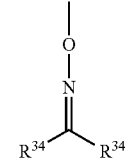

(2-2)

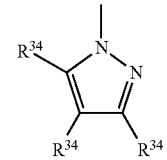

wherein each of $R^{34}$ represents at least one of a hydrogen atom and a linear or branched alkyl group having 1 to 10 carbon atoms.

12 Claims, 4 Drawing Sheets

(51) Int. Cl.
*G03F 7/40* (2006.01)
*G03F 7/00* (2006.01)
*G03F 7/039* (2006.01)
*H01L 21/027* (2006.01)

(56) References Cited

U.S. PATENT DOCUMENTS

| | | |
|---|---|---|
| 2010/0062379 A1 | 3/2010 | Iwashita |
| 2010/0068650 A1 | 3/2010 | Nishimura et al. |
| 2011/0111349 A1* | 5/2011 | Wakamatsu et al. .......... 430/324 |
| 2011/0223544 A1 | 9/2011 | Yada et al. |
| 2012/0244478 A1 | 9/2012 | Nakamura et al. |

FOREIGN PATENT DOCUMENTS

| | | |
|---|---|---|
| JP | 10-303114 | 11/1998 |
| JP | 2002-229205 | 8/2002 |
| JP | 2005-338849 | * 12/2005 |
| JP | 2007-171572 | 7/2007 |
| JP | 2008-078220 | 4/2008 |
| JP | 2009-042752 | 2/2009 |
| JP | 2009-069817 | 4/2009 |
| WO | 2008/117693 | 10/2008 |

OTHER PUBLICATIONS

Machine translation of JP 2007-171572, published on Jul. 5, 2007.*
Sungkoo Lee et al., "Double exposure technology using silicon containing materials", SPIE, 2006, vol. 6153 61531 K.
International Preliminary Report on Patentability with Translation of Written Opinion issued Feb. 8, 2011 in PCT/JP2009/062710.
Office Action issued Sep. 28, 2012 in Chinese Patent Application No. 200980125353.1(with English-language Translation).

* cited by examiner

RESIN COMPOSITION FOR MAKING RESIST PATTERN INSOLUBLE, AND METHOD FOR FORMATION OF RESIST PATTERN BY USING THE SAME

CROSS-REFERENCE TO RELATED APPLICATIONS

The present application is a continuation application of the U.S. patent application Ser. No. 13/004,898 filed Jan. 12, 2011, which in turn is a continuation application of International Application No. PCT/JP2009/062710, filed Jul. 14, 2009, which claims priority to Japanese Patent Application No. 2008-183038, filed Jul. 14, 2008. The contents of these applications are incorporated herein by reference in their entirety.

BACKGROUND OF THE INVENTION

1. Field of the Invention

The present invention relates to a resist pattern-insolubilizing resin composition and a resist pattern-forming method using the same.

2. Discussion of the Background

In the field of microfabrication (e.g., production of integrated circuit devices), lithographic technology that enables microfabrication with a line width of 0.10 μm or less has been desired to achieve a higher degree of integration. As a resist that is suitable for excimer laser light, various resists (chemically-amplified resists) that utilize a chemical amplification effect due to an acid-dissociable functional group-containing component and a component that generates an acid upon irradiation (exposure) (hereinafter referred to as "acid generator") have been proposed (see Japanese Patent Application Publication (KOKAI) No. 1993-232704, for example).

Lithographic technology that can form a finer pattern (e.g., a fine resist pattern with a line width of about 45 nm) is expected to be required. Such a fine pattern may be formed by reducing the wavelength of the light source of the exposure system (e.g., ArF excimer laser (wavelength: 193 nm)), or increasing the numerical aperture (NA) of the lens, for example. However, an expensive exposure system is required to reduce the wavelength of the light source. When increasing the numerical aperture (NA) of the lens, since the resolution and the depth of focus have a trade-off relationship, a decrease in depth of focus occurs when increasing the resolution.

In recent years, liquid immersion lithography has been proposed as lithographic technology that can solve the above problems (see Japanese Patent Application Publication (KOKAI) No. 1998-303114, for example).

However, it is considered that liquid immersion lithography can only be applied up to 45 nmhp. Therefore, technical development toward a 32 nmhp generation has been conducted. In recent years, technology that forms a 32 nm line-and-space (LS) pattern by forming isolated line patterns or trench patterns by a half pitch utilizing double patterning (DP) or double exposure (DE) has been proposed to deal with a demand for an increase in complexity and density of devices (see SPIE 2006, Vol. 6153 61531K, for example).

SPIE 2006, Vol. 6153 61531K discloses forming 32 nm lines at a pitch of 1:3, followed by etching. 32 nm lines are formed at a pitch of 1:3 at positions displaced from the first-layer resist pattern by a half pitch, followed by etching to obtain 32 nm lines at a 1:1 pitch.

However, a material that may suitably be used for double exposure utilizing liquid immersion lithography has not been proposed. Moreover, when forming a second-layer resist pattern using the above method after forming a first-layer resist pattern, the first-layer resist pattern may be deformed, so that the lines may be formed with insufficient accuracy.

SUMMARY OF THE INVENTION

According to one aspect of the present invention, a resist pattern-insolubilizing resin composition is used in a resist pattern-forming method. The resist pattern-insolubilizing resin composition includes a solvent and a resin. The resin includes a first repeating unit and at least one of a second repeating unit and a third repeating unit. The first repeating unit includes a hydroxyl group in its side chain. The second repeating unit is derived from a monomer shown by a following formula (1-1). The third repeating unit is derived from a monomer shown by a following formula (1-2). The resist pattern-forming method includes forming a first resist layer on a substrate using a first positive-tone radiation-sensitive resin composition. The first resist layer is selectively exposed through a mask. The first resist layer is developed to form a first resist pattern. The resist pattern-insolubilizing resin composition is applied to the first resist pattern. The resist pattern-insolubilizing resin composition is baked or UV-cured. The resist pattern-insolubilizing resin composition is washed to form an insolubilized resist pattern that is insoluble in a developer and a second positive-tone radiation-sensitive resin composition. A second resist layer is formed on the substrate on which the insolubilized resist pattern is formed using the second positive-tone radiation-sensitive resin composition. The second resist layer is selectively exposed through a mask. The second resist layer is developed to form a second resist pattern,

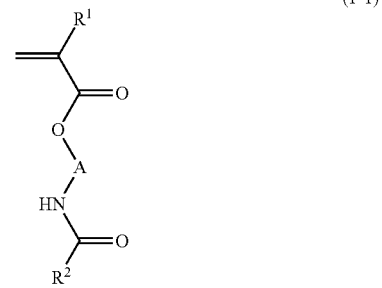

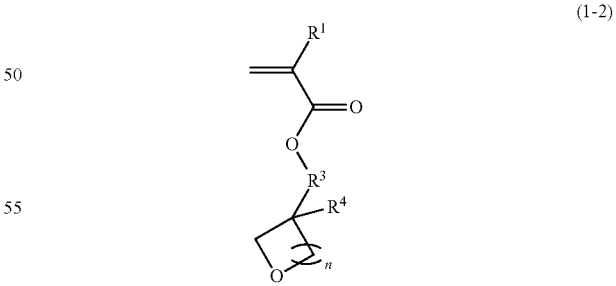

wherein $R^1$ represents a hydrogen atom, a methyl group, or a trifluoromethyl group, A represents a methylene group, an ethylene group, or a propylene group, $R^2$ represents a group shown by a following formula (2-1) or a group shown by a following formula (2-2), $R^3$ represents a methylene group or an alkylene group having 2 to 6 carbon atoms, $R^4$ represents a hydrogen atom, a methyl group, or an ethyl group, and n is 0 or 1,

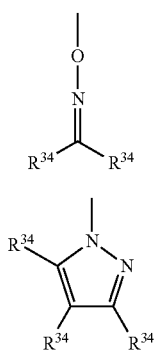

(2-1)

(2-2)

wherein each of $R^{34}$ represents at least one of a hydrogen atom and a linear or branched alkyl group having 1 to 10 carbon atoms.

According to another aspect of the present invention, a resist pattern-forming method includes providing a first positive-tone radiation-sensitive resin composition on a substrate to form a first resist layer on the substrate. The first resist layer is selectively exposed through a mask. The first resist layer is developed to form a first resist pattern. The above resist pattern-insolubilizing resin composition is applied to the first resist pattern. The resist pattern-insolubilizing resin composition is baked or UV-cured. The resist pattern-insolubilizing resin composition is washed to form an insolubilized resist pattern that is insoluble in a developer and a second positive-tone radiation-sensitive resin composition. The second positive-tone radiation-sensitive resin composition is provided on the substrate to form a second resist layer on the substrate on which the insolubilized resist pattern is formed. The second resist layer is selectively exposed through a mask. The second resist layer is developed to form a second resist pattern.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
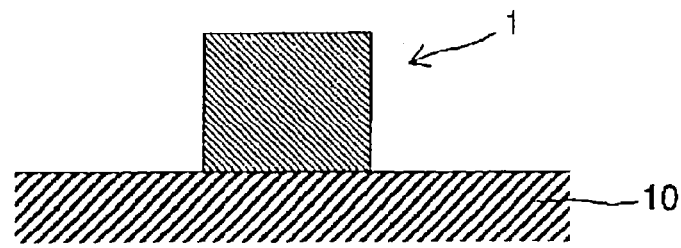
FIG. 1 is a cross-sectional view showing an example of a step (1) of a resist pattern-forming method according to one embodiment of the invention (i.e., a state in which a first resist pattern is formed on a substrate)

The embodiments of the invention are described with reference to the accompanying drawings, wherein like reference numerals designate corresponding or identical elements throughout the various drawings. Note that the embodiments of the invention are not limited to the following embodiments. Various modifications and improvements may be made of the following embodiments without departing from the scope of the invention based on the knowledge of a person having ordinary skill in the art. Note that the term "resist pattern-insolubilizing resin composition" may be referred to as "insolubilizing resin composition".

I. Resist Pattern-Insolubilizing Resin Composition

A resist pattern-insolubilizing resin composition according to one embodiment of the invention is used for a resist pattern-forming method according to one embodiment of the invention described later so that a first resist pattern forms an insolubilized resist pattern. The resist pattern-insolubilizing resin composition includes a resin and a solvent, the resin including a repeating unit that includes a hydroxyl group in its side chain, and at least one of a repeating unit derived from a monomer shown by the following general formula (1-1) and a repeating unit derived from a monomer shown by the following general formula (1-2).

1. Resin

The resin includes a repeating unit that includes a hydroxyl group in its side chain, and at least one of a repeating unit derived from a monomer shown by the following general formula (1-1) and a repeating unit derived from a monomer shown by the following general formula (1-2).

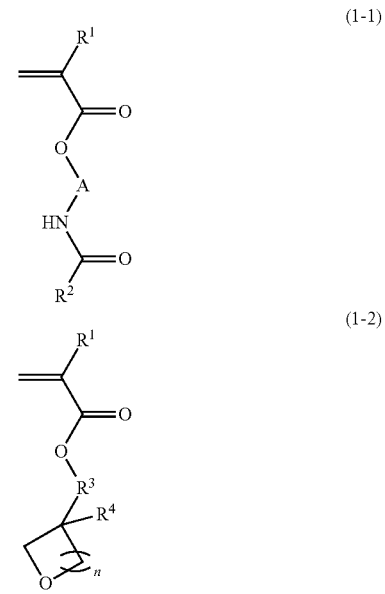

(1-1)

(1-2)

wherein $R^1$ represents a hydrogen atom, a methyl group, or a trifluoromethyl group, A represents a methylene group, an ethylene group, or a propylene group, $R^2$ represents a group shown by the following general formula (2-1) or a group shown by the following general formula (2-2), $R^3$ represents a methylene group or an alkylene group having 2 to 6 carbon atoms, $R^4$ represents a hydrogen atom, a methyl group, or an ethyl group, and n is 0 or 1,

(2-1)

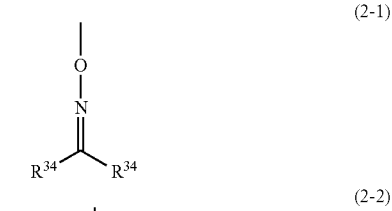

(2-2)

wherein $R^{34}$ individually represent a hydrogen atom or a linear or branched alkyl group having 1 to 10 carbon atoms.
(1) Repeating Unit that Includes Hydroxyl Group in its Side Chain The repeating unit that includes a hydroxyl group in its side chain is preferably a repeating unit derived from a monomer shown by the following general formula (4) (hereinafter referred to as "monomer (1)").

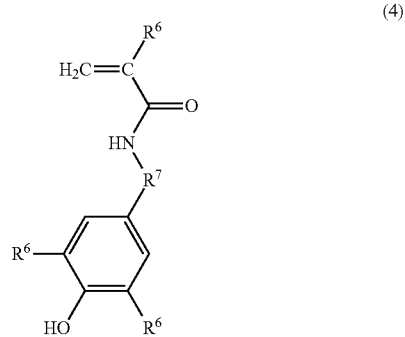

(4)

wherein $R^6$ individually represent a hydrogen atom or a methyl group, and $R^7$ represents a single bond or a linear, branched, or cyclic divalent hydrocarbon group.

Specific examples of the linear or cyclic divalent hydrocarbon group represented by $R^7$ in the general formula (4) include chain-like hydrocarbon groups such as a methylene group, an ethylene group, a propylene group (e.g., 1,3-propylene group and 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, an ethylidene group, a 1-propylidene group, and a 2-propylidene group; monocyclic hydrocarbon groups such as a cycloalkylene group having 3 to 10 carbon atoms, such as a cyclobutylene group (e.g., 1,3-cyclobutylene group), a cyclopentylene group (e.g., 1,3-cyclopentylene group), a cyclohexylene group (e.g., 1,4-cyclohexylene group), and a cyclooctylene group (e.g., 1,5-cyclooctylene group); crosslinked cyclic hydrocarbon groups such as a dicyclic to tetracyclic hydrocarbon group having 4 to 30 carbon atoms, such as a norbornylene group (e.g., 1,4-norbornylene group and 2,5-norbornylene group), and an admantylene group (e.g., 1,5-admantylene group and 2,6-admantylene group); and the like.

The monomer (1) is particularly preferably at least one of hydroxyacrylanilide or hydroxymethacrylanilide (hereinafter referred to as "hydroxy(meth)acrylanilide") wherein $R^7$ represents a single bond.

The monomer (1) is normally used in an amount of 30 to 95 mol %, and preferably 40 to 90 mol %, based on the total amount (=100 mol %) of the monomer components included in the resin.

(2) At Least One of Repeating Unit Derived from Monomer Shown by General Formula (1-1) and Repeating Unit Derived from Monomer Shown by General Formula (1-2)

Examples of the monomers shown by the general formulas (1-1) and (1-2) (hereinafter referred to as "monomer (2)") include glycidyl methacrylate, glycidyl acrylate, (1-ethyl-1-oxetanyl)methyl methacrylate ("OXMA" manufactured by Ube Industries, Ltd.), 2-[(3,5-dimethylpyrazolyl)carbonylamino]ethyl methacrylate ("MOI-BP" manufactured by Showa Denko K.K.), 2-[0-(1-methylpropylideneamino)carbonylamino]ethyl methacrylate ("MOI-BM" manufactured by Showa Denko K.K.), and the like.

The monomer (2) is normally used in an amount of 5 to 60 mol %, preferably 5 to 50 mol %, and more preferably 5 to 40 mol %, based on the total amount (=100 mol %) of the monomer components included in the resin.

(3) Repeating Unit Derived from Monomer Shown by General Formula (3)

The resin preferably further includes a repeating unit derived from a monomer shown by the following general formula (3) (hereinafter referred to as "monomer (3)").

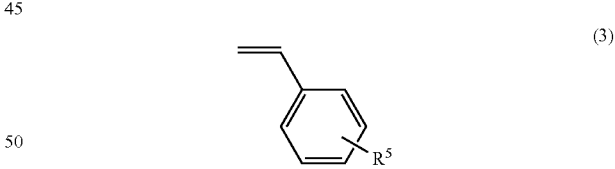

(3)

wherein $R^5$ represents a hydrogen atom, a linear or branched alkyl group having 1 to 8 carbon atoms, or a linear or branched alkoxy group having 1 to 8 carbon atoms.

$R^5$ in the general formula (3) preferably represents a t-butyl group, an acetoxy group, or a 1-ethoxyethoxy group, and more preferably represents a t-butyl group.

The monomer (3) is a styrene derivative, and preferably a monomer that includes a specific functional group that can be converted into a phenolic hydroxyl group after copolymerization (hereinafter referred to as "specific functional group-containing monomer"). Specific examples of the specific functional group-containing monomer include p-acetoxystyrene, α-methyl-p-acetoxystyrene, p-benzyloxystyrene, p-t-butoxystyrene, p-t-butoxycarbonyloxystyrene, p-t-butyldimethylsiloxystyrene, and the like. The specific functional group may be easily converted into a phenolic hydroxyl group by copolymerizing the specific functional group-containing monomer with another monomer, and subjecting the resulting copolymer to an appropriate treatment (e.g., hydrolysis using hydrochloric acid).

The monomer (3) is normally used in an amount of 5 to 65 mol %, and preferably 10 to 50 mol %, based on the total amount (=100 mol %) of the monomer components included in the resin.

The resin preferably further includes a repeating unit derived from at least one monomer (hereinafter referred to as "additional monomer") selected from the group consisting of a monomer that includes an alcoholic hydroxyl group (hereinafter referred to as "monomer (4)"), a monomer that includes a hydroxyl group derived from an organic acid (e.g., carboxylic acid) (hereinafter referred to as "monomer (5)"), and a monomer that includes a phenolic hydroxyl group (hereinafter referred to as "monomer (6)"). Note that the monomer (6) excludes the monomer (1).

(4) Monomer (4)

Examples of the monomer (4) includes hydroxyalkyl (meth)acrylates such as 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate, and glycerol monomethacrylate, and the like. Among these, 2-hydroxyethyl acrylate and 2-hydroxyethyl methacrylate are preferable. These monomers (4) may be used either individually or in combination.

The monomer (4) is normally used in an amount of 5 to 65 mol %, and preferably 10 to 60 mol %, based on the total amount (=100 mol %) of the monomer components included in the resin.

(5) Monomer (5)

Examples of the monomer (5) include (meth)acrylic acid and (meth)acrylic acid derivatives such as monocarboxylic acids such as acrylic acid, methacrylic acid, crotonic acid, 2-succinoloylethyl(meth)acrylate, 2-maleinoloylethyl(meth)acrylate, 2-hexahydrophthaloylethyl(meth)acrylate, ω-carboxypolycaprolactone monoacrylate, monohydroxyethyl phthalate acrylate, an acrylic acid dimer, 2-hydroxy-3-phenoxypropyl acrylate, t-butoxy methacrylate, and t-butyl acrylate, and dicarboxylic acids such as maleic acid, fumaric acid, citraconic acid, mesaconic acid, and itaconic acid, and the like. Among these, acrylic acid, methacrylic acid, and 2-hexahydrophthaloylethyl methacrylate are preferable. These monomers (5) may be used either individually or in combination.

The monomer (5) is normally used in an amount of 5 to 65 mol %, and preferably 10 to 60 mol %, based on the total amount (=100 mol %) of the monomer components included in the resin.

A commercially available product may be used as the monomer (5). For example, ω-carboxy-polycaprolactone monoacrylate is commercially available as Aronix M-5300 (manufactured by Toagosei Co., Ltd.). An acrylic acid dimer is commercially available as Aronix M-5600 (manufactured by Toagosei Co., Ltd.). 2-Hydroxy-3-phenoxypropyl acrylate is commercially available as Aronix M-5700 (manufactured by Toagosei Co., Ltd.).

(6) Monomer (6)

Examples of the monomer (6) include p-hydroxystyrene, m-hydroxystyrene, o-hydroxystyrene, α-methyl-p-hydroxystyrene, α-methyl-m-hydroxystyrene, α-methyl-o-hydroxystyrene, 2-allylphenol, 4-allylphenol, 2-allyl-6-methylphenol, 2-allyl-6-methoxyphenol, 4-allyl-2-methoxyphenol, 4-allyl-2,6-dimethoxyphenol, 4-allyloxy-2-hydroxybenzophenone, and the like. Among these, p-hydroxystyrene and α-methyl-p-hydroxystyrene are preferable.

The monomer (6) is normally used in an amount of 5 to 65 mol %, preferably 5 to 50 mol %, and more preferably 5 to 45 mol %, based on the total amount (=100 mol %) of the monomer components included in the resin.

The additional monomer is used in an amount within the above range. If the amount of the additional monomer is too small, the resist pattern may shrink since a reaction site with a crosslinkable component described later may be insufficient. If the amount of the additional monomer is too large, swelling may occur during development, so that the resist pattern may be buried. Specifically, if the amount of the additional monomer is outside the above range, it may be difficult to suppress a change in line width of the insolubilized resist pattern formed using the resist pattern-insolubilizing resin composition.

The resin may further include a repeating unit derived from a further additional monomer in order to control the hydrophilicity and the solubility of the resin.

(7) Further Additional Monomer

Examples of the further additional monomer include aryl (meth)acrylates, dicarboxylic diesters, nitrile group-containing polymerizable compounds, amide bond-containing polymerizable compounds, vinyl compounds, allyl compounds, chlorine atom-containing polymerizable compounds, conjugated diolefins, and the like. Specific examples of the further additional monomer include dicarboxylic diesters such as diethyl maleate, diethyl fumarate, and diethyl itaconate; aryl (meth)acrylates such as phenyl (meth)acrylate and benzyl (meth)acrylate; (meth)acrylates such as t-butyl(meth)acrylate and 4,4,4-trifluoro-3-hydroxy-1-methyl-3-trifluoromethyl-1-butyl(meth)acrylate; nitrile group-containing polymerizable compounds such as acrylonitrile and methacrylonitrile; amide bond-containing polymerizable compounds such as acrylamide and methacrylamide; fatty-acid vinyl compounds such as vinyl acetate; chlorine atom-containing polymerizable compounds such as vinyl chloride and vinylidene chloride; conjugated diolefins such as 1,3-butadiene, isoprene, and 1,4-dimethylbutadiene; and the like. These further additional monomers may be used either individually or in combination.

Specific examples of a preferable further additional monomer include a compound shown by the following general formula (5).

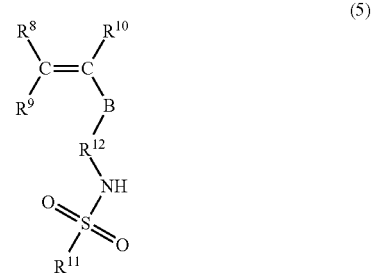

(5)

wherein $R^8$ to $R^{10}$ individually represent a hydrogen atom, an alkyl group having 1 to 10 carbon atoms, a hydroxymethyl group, a trifluoromethyl group, or a phenyl group, $R^{11}$ represents a monovalent organic group, $R^{12}$ represents a single bond or a divalent organic group having 1 to 20 carbon atoms, and B represents a single bond, an oxygen atom, a carbonyl group, a carbonyloxy group, or an oxycarbonyl group.

Examples of the alkyl group having 1 to 10 carbon atoms represented by $R^8$ to $R^{10}$ in the general formula (5) include a methyl group, an ethyl group, a propyl group, a butyl group, a pentyl group, a hexyl group, a heptyl group, an octyl group, a nonyl group, a decyl group, and the like. Note that $R^8$ and $R^9$ represent a hydrogen atom, and $R^{10}$ represents a hydrogen atom or a methyl group.

The monovalent organic group represented by $R^{11}$ in the general formula (5) is preferably a monovalent organic group that includes a fluorine atom, more preferably a fluoroalkyl group having 1 to 20 carbon atoms, and particularly preferably a fluoroalkyl group having 1 to 4 carbon atoms.

Specific examples of the fluoroalkyl group having 1 to 20 carbon atoms include a difluoromethyl group, a perfluoromethyl group, a 1,1-difluoroethyl group, a 2,2-difluoroethyl group, a 2,2,2-trifluoroethyl group, a perfluoroethyl group, a 1,1,2,2-tetrafluoropropyl group, a 1,1,2,2,3,3-hexafluoropropyl group, a perfluoroethylmethyl group, a 1-(trifluoromethyl)-1,2,2,2-tetrafluoroethyl group, a perfluoropropyl group, a 1,1,2,2-tetrafluorobutyl group, a 1,1,2,2,3,3-hexafluorobutyl group, a 1,1,2,2,3,3,4,4-octafluorobutyl group, a perfluorobutyl group, a 1,1-bis(trifluoro)methyl-2,2,2-trifluoroethyl group, a 2-(perfluoropropyl)ethyl group, a 1,1,2,2,3,3,4,4-octafluoropentyl group, a perfluoropentyl group, a 1,1,2,2,3,3,4,4,5,5-decafluoropentyl group, a 1,1-bis(trifluoromethyl)-2,2,3,3,3-pentafluoropropyl group, a perfluoropentyl group, a 2-(perfluorobutyl)ethyl group, a 1,1,2,2,3,3,4,4,5,5-decafluorohexyl group, a 1,1,2,2,3,3,4,4,5,5,6,6-dodecafluorohexyl group, a perfluoropentylmethyl group, a perfluorohexyl group, a 2-(perfluoropentyl)ethyl group, a 1,1,2,2,3,3,4,4,5,5,6,6-dodecafluoroheptyl group, a perfluorohexylmethyl group, a perfluoroheptyl group, a 2-(perfluorohexyl)ethyl group, a 1,1,2,2,3,3,4,4,5,5,6,6,7,7-tetradecafluorooctyl group, a perfluoroheptylmethyl group, a perfluorooctyl group, a 2-(perfluoroheptyl)ethyl group, a 1,1,2,2,3,3,4,4,5,5,6,6,7,7,8,8-hexadecafluorononyl group, a perfluorooctylmethyl group, a perfluorononyl group, a 2-(perfluorooctyl)ethyl group, a 1,1,2,2,3,3,4,4,5,5,6,6,7,7,8,8,9,9-octadecafluorodecyl group, a perfluorononylmethyl group, a perfluorodecyl group, and the like.

If the number of carbon atoms of the fluoroalkyl group is too large, the solubility of the resin in an alkaline solution may decrease. Therefore, a perfluoromethyl group, a perfluoroethyl group, and a perfluoropropyl group are preferable.

Specific examples of the divalent organic group having 1 to 20 carbon atoms represented by $R^{12}$ in the general formula (5) include saturated chain-like hydrocarbon groups such as a methylene group, an ethylene group, a propylene group (e.g., 1,3-propylene group and 1,2-propylene group), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, an icosylene group, a 1-methyl-1,3-propylene group, a 2-methyl-1,3-propylene group, a 2-methyl-1,2-propylene group, a 1-methyl-1,4-butylene group, a 2-methyl-1,4-butylene group, an ethylidene group, a 1-propylidene group, and a 2-propylidene group; monocyclic hydrocarbon groups such as a cycloalkylene group having 3 to 10 carbon atoms, such as a cyclobutylene group (e.g., 1,3-cyclobutylene group), a cyclopentylene group (e.g., 1,3-cyclopentylene group), a cyclohexylene group (e.g., 1,4-cyclohexylene group), and a cyclooctylene group (e.g., 1,5-cyclooctylene group); crosslinked cyclic hydrocarbon groups such as a dicyclic to tetracyclic hydrocarbon group having 4 to 20 carbon atoms, such as a norbornylene group (e.g., 1,4-norbornylene group and 2,5-norbornylene group) and an admantylene group (e.g., 1,5-admantylene group and 2,6-admantylene group); and the like.

Further examples of a preferable monomer shown by the general formula (5) include 2-(((trifluoromethyl)sulfonyl)amino)ethyl-1-methacrylate, 2-(((trifluoromethyl)sulfonyl)amino)ethyl-1-acrylate, and the compounds shown by the following formulas (5-1) to (5-6).

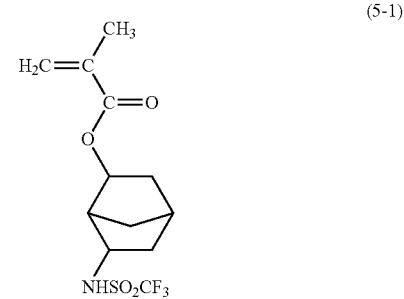

(5-1)

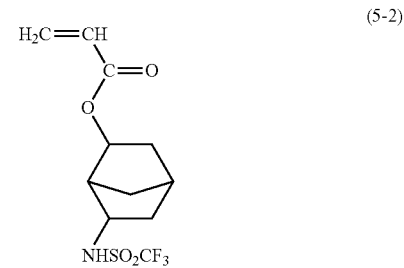

(5-2)

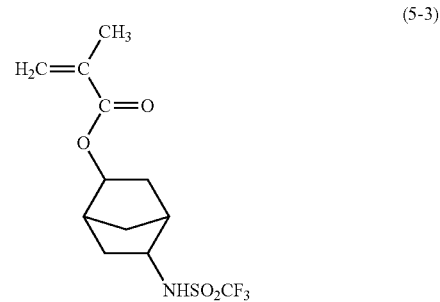

(5-3)

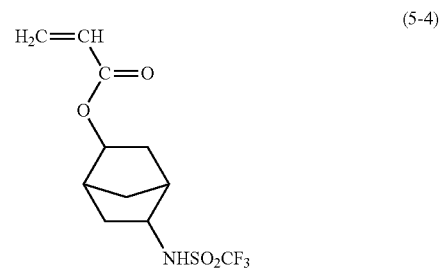

(5-4)

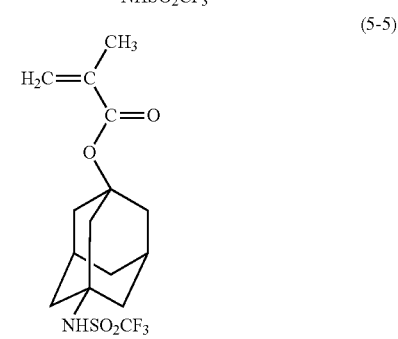

(5-5)

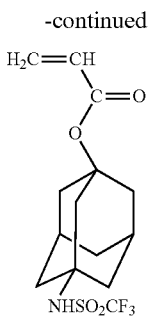

(5-6)

The further additional monomer is normally used in an amount of 1 to 50 mol %, preferably 2 to 30 mol %, and more preferably 2 to 20 mol %, based on the total amount (=100 mol %) of the monomer components included in the resin.

(Preparation Method)

The resin may be prepared by polymerizing the monomer components in an appropriate solvent optionally in the presence of a chain transfer agent using a radical initiator (e.g., hydroperoxide, dialkyl peroxide, diacyl peroxide, or azo compound), for example.

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutane, bromohexane, dichloroethane, hexamethylene dibromide, and chlorobenzene; saturated carboxylates such as ethyl acetate, n-butyl acetate, i-butyl acetate, methyl propionate, and propylene glycol monomethyl ether acetate; alkyllactones such as γ-butyrolactone; ethers such as tetrahydrofuran, dimethoxyethanes, and diethoxyethane; alkylketones such as 2-butanone, 2-heptanone, and methyl isobutyl ketone; cycloalkylketones such as cyclohexanone; alcohols such as 2-propanol, 1-butanol, 4-methyl-2-pentanol, and propylene glycol monomethyl ether; and the like. These solvents may be used either individually or in combination.

The reaction temperature is normally 40 to 120° C., and preferably 50 to 100° C. The reaction time is normally 1 to 48 hours, and preferably 1 to 24 hours.

It is preferable that the resin have a high purity. Specifically, it is preferable that the resin have a low impurity (e.g., halogen or metal) content and a low residual monomer/oligomer content (e.g., 0.1 mass % or less (determined by HPLC)). The process stability and the accuracy of the shape of the resist pattern can be improved using an insolubilizing resin composition that includes a resin having a high purity.

The resin may be purified as follows, for example. Specifically, impurities (e.g., metal) may be removed by causing metals included in the polymer solution to be adsorbed on a zeta-potential filter, or washing the polymer solution with an acidic aqueous solution (e.g., oxalic acid or sulfonic acid aqueous solution) to remove metals in a chelate state, for example. The residual monomer/oligomer content may be reduced to equal to or lower than a given value by liquid-liquid extraction that removes residual monomers and oligomers by washing with water or combining appropriate solvents, purification in a solution state (e.g., ultrafiltration) that extracts and removes only components having a molecular weight equal to or less than a given value, reprecipitation that removes residual monomers and the like by adding the polymer solution to a poor solvent dropwise so that the resin coagulates in the poor solvent, purification in a solid state that washes the resin collected by filtration with a poor solvent, or the like. These methods may be used in combination.

(Properties)

The polystyrene-reduced weight average molecular weight (Mw) of the resin determined by gel permeation chromatography (GPC) is normally 1000 to 500,000, preferably 1000 to 50,000, and still more preferably 1000 to 20,000. If the Mw of the resin is more than 500,000, it may be difficult to remove the thermally cured resin using a developer. If the Mw of the resin is less than 1000, it may be difficult to form a uniform film.

2. Solvent

The solvent included in the insolubilizing resin composition according to one embodiment of the invention is not particularly limited insofar as the resin and an optional crosslinkable component can be sufficiently dissolved therein, and a first resist pattern formed using a first positive-tone radiation-sensitive resin composition is not dissolved therein. The solvent is preferably an alcohol solvent.

The solvent is preferably used in the insolubilizing resin composition in an amount of 80 mass % or more, and more preferably 90 mass % or more.

The water content of the solvent is preferably 10 mass % or less, and more preferably 3 mass % or less. If the water content of the solvent is more than 10 mass %, the solubility of the resin may decrease. The solvent is particularly preferably an alcohol-containing non-aqueous solvent (i.e., an absolute alcohol solvent that does not substantially include water).

(1) Alcohol Solvent

A monohydric alcohol having 1 to 8 carbon atoms is preferable as the alcohol solvent. Specific examples of the monohydric alcohol having 1 to 8 carbon atoms include 1-propanol, isopropyl alcohol, 1-butanol, 2-butanol, t-butanol, 1-pentanol, 2-pentanol, 3-pentanol, 2-methyl-1-butanol, 3-methyl-1-butanol, 3-methyl-2-butanol, 1-hexanol, 2-hexanol, 3-hexanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 1-heptanol, 2-heptanol, 2-methyl-2-heptanol, 2-methyl-3-heptanol, and the like. Among these, 1-butanol, 2-butanol, and 4-methyl-2-pentanol are preferable. These alcohol solvents may be used either individually or in combination.

The insolubilizing resin composition may include an additional solvent other than the alcohol solvent in order to adjust the applicability when applying the insolubilizing resin composition to the first resist pattern. The additional solvent may be a solvent that allows uniform application of the insolubilizing resin composition without dissolving the first resist pattern.

(2) Additional Solvent

Specific examples of the additional solvent include cyclic ethers such as tetrahydrofuran and dioxane; alkyl ethers of polyhydric alcohols such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohols such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, ethyl 2-hydroxy-2-methylpropionate, ethoxyethyl acetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate, and butyl acetate; water; and the like. Among these, cyclic ethers, alkyl ethers of polyhydric alcohols, alkyl ether acetates of polyhydric alcohols, ketones, esters, and water are preferable.

The additional solvent is normally used in an amount of 30 mass % or less, and preferably 20 mass % or less, based on the total amount (=100 mass %) of the solvent. If the amount of the additional solvent is more than 30 mass %, the first resist pattern may be dissolved so that intermixing with the insolubilizing resin composition may occur (i.e., the first resist pattern may be buried). When the additional solvent is water, water is preferably used in an amount of 10 mass % or less.

3. Crosslinkable Component

The resist pattern-insolubilizing resin composition according to one embodiment of the invention may optionally include a crosslinkable component. The crosslinkable component reacts with the resin and/or another crosslinkable component due to an acid, so that the resin is cured.

When the insolubilizing resin composition includes the crosslinkable component, the crosslinkable component is preferably used in an amount of 1 to 100 parts by mass, and more preferably 5 to 70 parts by mass, based on 100 parts by mass of the resin. If the amount of the crosslinkable component is less than 1 part by mass, the resin may be insufficiently cured, so that resist pattern may not shrink. If the amount of the crosslinkable component is more than 100 parts by mass, the resin may be cured to a large extent, so that the resist pattern may be buried.

The total content of the resin and the crosslinkable component is preferably 0.1 to 30 mass %, and more preferably 1 to 20 mass %, based on 100 mass % of the insolubilizing resin composition. If the amount of the crosslinkable component is less than 0.1 mass %, the resulting film may break at the pattern edge due to a decrease in thickness. If the amount of the crosslinkable component is more than 30 mass %, the viscosity of the composition may increase to a large extent, so that it may be difficult to embed the composition in a fine pattern.

The crosslinkable component preferably includes a compound that includes a group shown by the following general formula (6) (hereinafter referred to as "crosslinkable component (1)"), or a compound that includes two or more cyclic ethers as reactive groups (hereinafter referred to as "crosslinkable component (2)"). It is also preferable that the crosslinkable component include both the crosslinkable component (1) and the crosslinkable component (2).

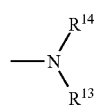

(6)

wherein $R^{13}$ and $R^{14}$ represent a hydrogen atom or a group shown by the following general formula (7), provided that at least one of $R^{13}$ and $R^{14}$ represents a group shown by the general formula (7).

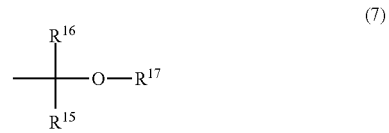

(7)

wherein $R^{15}$ and $R^{16}$ individually represent a hydrogen atom, an alkyl group having 1 to 6 carbon atoms, or an alkoxyalkyl group having 1 to 6 carbon atoms, or bond to form a ring having 2 to 10 carbon atoms, and $R^{17}$ represents a hydrogen atom or an alkyl group having 1 to 6 carbon atoms.

(1) Crosslinkable Component (1)

Examples of the crosslinkable component (1) include compounds including a functional group such as an imino group, a methylol group, or a methoxymethyl group in the molecule. Specific examples of these compounds include nitrogen-containing compounds obtained by alkyl-etherification of all or some of the active methylol groups of (poly)methylolated melamine, (poly)methylolated glycoluril, (poly)methylolated benzoquanamine, (poly)methylolated urea, or the like.

Examples of the alkyl group used for alkyl-etherification include a methyl group, an ethyl group, a butyl group, and a combination thereof. The nitrogen-containing compound may include a self-condensed oligomer component. Specific examples of such a nitrogen-containing compound include hexamethoxymethylated melamine, hexabutoxymethylated melamine, tetramethoxymethylated glycoluril, tetrabutoxymethylated glycoluril, and the like.

A commercially available product may be used as the crosslinkable component (1). Examples of commercially available products of the crosslinkable component (1) include Cymel 300, Cymel 301, Cymel 303, Cymel 350, Cymel 232, Cymel 235, Cymel 236, Cymel 238, Cymel 266, Cymel 267, Cymel 285, Cymel 1123, Cymel 1123-10, Cymel 1170, Cymel 370, Cymel 771, Cymel 272, Cymel 1172, Cymel 325, Cymel 327, Cymel 703, Cymel 712, Cymel 254, Cymel 253, Cymel 212, Cymel 1128, Cymel 701, Cymel 202, and Cymel 207(manufactured by Nihon Cytec Industries, Inc.), Nikalac MW-30M, Nikalac MW-30, Nikalac MW-22, Nikalac MW-24X, Nikalac MS-21, Nikalac MS-11, Nikalac MS-001, Nikalac MX-002, Nikalac MX-730, Nikalac MX-750, Nikalac MX-708, Nikalac MX-706, Nikalac MX-042, Nikalac MX-035, Nikalac MX-45, Nikalac MX-410, Nikalac MX-302, Nikalac MX-202, Nikalac SM-651, Nikalac SM-652, Nikalac SM-653, Nikalac SM-551, Nikalac SM-451, Nikalac SB-401, Nikalac SB-355, Nikalac SB-303, Nikalac SB-301, Nikalac SB-255, Nikalac SB-203, Nikalac SB-201, Nikalac BX-4000, Nikalac BX-37, Nikalac BX-55H, and Nikalac BL-60 (manufactured by Sanwa Chemical Co., Ltd.), Aron Oxetane OXT-101, OXT-121, OXT-221 (manufactured by Toagosei Co., Ltd.), OXTP, OXBP (manufactured by Ube Industries, Ltd.), and the like. Among these, Cymel 325, Cymel 327, Cymel 703, Cymel 712, Cymel 254, Cymel 253, Cymel 212, Cymel 1128, Cymel 701, Cymel 202, and Cymel 207 (corresponding to the compound shown by the general formula (6) wherein $R^{13}$ or $R^{14}$ represents a hydrogen atom (i.e., imino group)) are preferable.

(2) Crosslinkable Component (2)

Specific examples of the crosslinkable component (2) include epoxycyclohexyl group-containing compounds such as 3,4-epoxycyclohexylmethyl-3',4'-epoxycyclohexane carboxylate, 2-(3,4-epoxycyclohexyl-5,5-spiro-3,4-epoxy)cyclohexane-m-dioxane, bis(3,4-epoxycyclohexylmethyl)adipate, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), ethylene glycol di(3,4-epoxycyclohexylmethyl) ether, ethylenebis(3,4-epoxycyclohexane carboxylate), E-caprolactone-modified 3,4-epoxycyclohexylmethyl-3',4'-epoxycyclohexane carboxylate, trimethylcaprolactone-modified 3,4-epoxycyclohexylmethyl-3',4'-epoxycyclohexane carboxylate, and β-methyl-δ-valerolactone-modified 3,4-epoxycyclohexylmethyl-3',4'-epoxycyclohexane carboxylate;

bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ether;

polyglycidyl ethers of a polyether polyol obtained by adding at least one alkylene oxide to an aliphatic polyhydric alcohol (e.g., ethylene glycol, propylene glycol, or glycerol); diglycidyl esters of an aliphatic long-chain dibasic acid; monoglycidyl ethers of an aliphatic higher alcohol; glycidyl esters of a higher fatty acid;

3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether, dicyclopentenyl bis(3-ethyl-3-oxetanylmethyl) ether, triethylene glycol bis(3-ethyl-3-oxetanylmethyl) ether, tetraethylene glycol bis(3-ethyl-3-oxetanylmethyl) ether, tricyclodecanediyldimethylene(3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl) ether, pentaerythritol tetrakis(3-ethyl-3-oxetanylmethyl) ether, polyethylene glycol bis(3-ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone-modified dipentaerythritol hexakis(3-ethyl-3-oxetanylmethyl) ether, caprolactone-modified dipentaerythritol pentakis(3-ethyl-3-oxetanylmethyl) ether, ditrimethylolpropane tetrakis(3-ethyl-3-oxetanylmethyl) ether, ethylene oxide (EO)-modified bisphenol A bis(3-ethyl-3-oxetanylmethyl) ether, propylene oxide (PO)-modified bisphenol A bis(3-ethyl-3-oxetanylmethyl) ether, EO-modified hydrogenated bisphenol A bis(3-ethyl-3-oxetanylmethyl) ether, PO-modified hydrogenated bisphenol A bis(3-ethyl-3-oxetanylmethyl) ether, EO-modified bisphenol F bis(3-ethyl-3-oxetanylmethyl) ether;

oxetane compounds including two or more oxetane rings in the molecule such as Aron Oxetane OXT-101, Aron Oxetane OXT-121, Aron Oxetane OXT-221 (manufactured by Toagosei Co., Ltd.), and OXTP, OXBP, OXIPA (manufactured by Ube Industries, Ltd.); and the like.

Among these, 1,6-hexanediol diglycidyl ether, dipentaerythritol hexakis(3-ethyl-3-oxetanylmethyl) ether, and OXIPA are preferable. These crosslinkable components (2) may be used either individually or in combination.

4. Surfactant

The resist pattern-insolubilizing resin composition according to one embodiment of the invention may optionally include a surfactant. The surfactant improves the applicability, defoamability, leveling properties, and the like of the insolubilizing resin composition. Specific examples of the surfactant include fluorine-containing surfactants such as BM-1000, BM-1100 (manufactured by BM Chemie), Megafac F142D, F172, F173, F183 (manufactured by DIC Corporation), Fluorad FC-135, FC-170C, FC-430, FC-431 (manufactured by Sumitomo 3M, Ltd.), Surflon S-112, S-113, S-131, S-141, S-145 (manufactured by Asahi Glass Co., Ltd.), SH-28PA, SH-190, SH-193, SZ-6032, SF-8428 (manufactured by Dow Corning Toray Silicone Co., Ltd.), and the like.

The surfactant is preferably used in an amount of 5 parts by mass or less based on 100 parts by mass of the resin.

II. Resist Pattern-Forming Method

A resist pattern-forming method according to one embodiment of the invention includes steps (1) to (4). A resist pattern that includes an insolubilized resist pattern and a second resist pattern can be formed on a substrate by the steps (1) to (4). A semiconductor device can be advantageously produced by utilizing the resist pattern thus formed.

1. Step (1)

FIG. 1 is a cross-sectional view showing an example of the step (1) of the resist pattern-forming method according to one embodiment of the invention (i.e., a state in which a first resist pattern is formed on a substrate). In the step (1), a first resist layer is formed on a substrate 10 using a first positive-tone radiation-sensitive resin composition (hereinafter may be referred to as "first resist material"), selectively exposed through a mask, and developed to form a first resist pattern 1.

(1) Formation of First Resist Layer

The first resist layer may be formed by applying the first resist material to the substrate 10 by an appropriate application method (e.g., spin coating, cast coating, or roll coating). After applying the first resist material, the resulting film may optionally be prebaked (PB) to vaporize the solvent. The PB temperature is appropriately selected depending on the composition of the first resist material, but is normally 30 to 200° C., and preferably 50 to 150° C.

A protective film may be formed on the first resist layer in order to prevent an adverse effect of basic impurities and the like present in the environmental atmosphere, as disclosed in Japanese Patent Application Publication (KOKAI) No. 5-188598, for example.

(i) Substrate

As the substrate, a silicon wafer, a wafer covered with SiN or an organic antireflective film, or the like may be used. In order to bring out the potential of the first resist material to a maximum extent, an organic or inorganic antireflective film may be formed on the substrate, as disclosed in Japanese Examined Patent Publication (KOKOKU) No. 6-12452, for example.

(ii) First Resist Material

The first resist material is a resist material described later.

(2) Exposure

The first resist layer is exposed by applying radiation to the desired area of the first resist layer through a mask having a given pattern to form an alkali-developable area (i.e., an area that has become alkali-soluble due to exposure). Radiation used for exposure is appropriately selected from visible rays, ultraviolet rays, deep ultraviolet rays, X-rays, electron beams, charged particle rays, and the like depending on the type of acid generator included in the first resist material. It is preferable to use deep ultraviolet rays such as ArF excimer laser light (wavelength: 193 nm) and KrF excimer laser light (wavelength: 248 nm). It is particularly preferable to use ArF excimer laser light (wavelength: 193 nm).

The exposure conditions (e.g., dose) are appropriately selected depending on the composition of the first resist material, the type of additive, and the like. It is preferable to perform post-exposure bake (PEB). The acid-dissociable group included in the first resist material dissociates smoothly due to PEB. The PEB temperature is appropriately selected depending on the composition of the first resist material, but is normally 30 to 200° C., and preferably 50 to 170° C.

(3) Formation of First Resist Pattern

The exposed first resist layer is developed using a developer so that the alkali-developable area (i.e., the exposed area of the first resist layer) is dissolved. The positive-tone first resist pattern 1 shown in FIG. 1 that has a given line width (i.e., has a given space area) is thus formed on the substrate 10. After development using an alkaline aqueous solution, the resist pattern is normally washed with water, and dried.

A developer that may be used for development is preferably an alkaline aqueous solution prepared by dissolving at least one alkaline compound (e.g., sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, or 1,5-diazabicyclo-[4.3.0]-5-nonene) in water. The concentration of the alkaline aqueous solution is normally 10 mass % or less. If the concentration of the alkaline aqueous solution is more than 10 mass %, the unexposed area may be easily dissolved in the developer.

An organic solvent may be added to the alkaline aqueous solution (developer). Examples of the organic solvent include ketones such as acetone, methyl ethyl ketone, methyl i-butyl ketone, cyclopentanone, cyclohexanone, 3-methylcyclopentanone, and 2,6-dimethylcyclohexanone; alcohols such as methanol, ethanol, n-propyl alcohol, i-propyl alcohol, n-butyl alcohol, t-butyl alcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like. These organic solvents may be used either individually or in combination.

The organic solvent is preferably used in an amount of 100 parts by volume or less based on 100 parts by volume of the alkaline aqueous solution. If the amount of the organic solvent is more than 100 parts by volume, the exposed area may remain undeveloped due to a decrease in developability. An appropriate amount of a surfactant or the like may be added to the developer.

2. Step (2)

Figure 2:
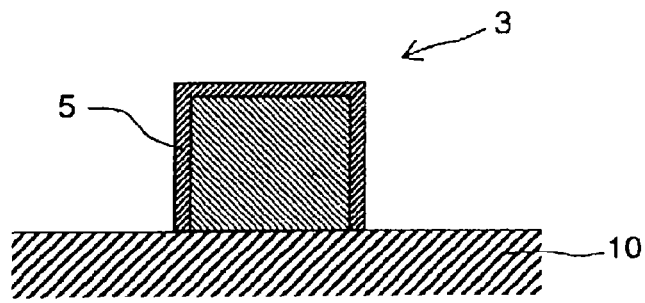
FIG. 2 is a cross-sectional view showing an example of a step (2) of a resist pattern-forming method according to one embodiment of the invention (i.e., a state in which an insolubilized resist pattern is formed)
Figure 3:
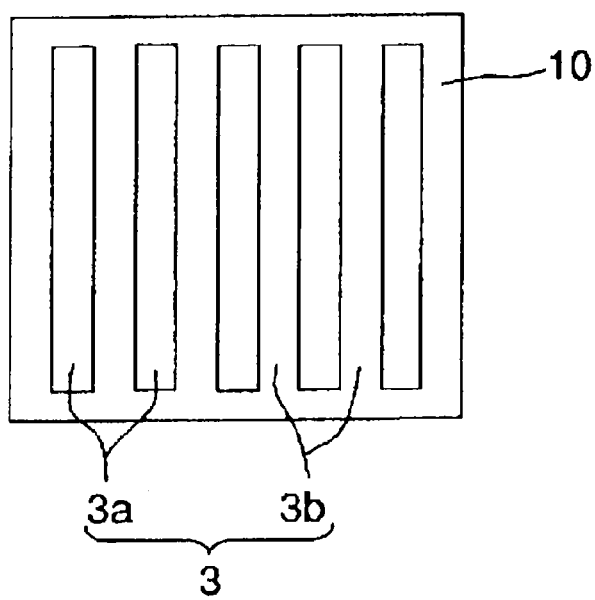
FIG. 3 is a schematic view showing an example of a step (2) of a resist pattern-forming method according to one embodiment of the invention (i.e., a state in which an insolubilized resist pattern is formed)

FIG. 2 is a cross-sectional view showing an example of the step (2) of the resist pattern-forming method according to one embodiment of the invention (i.e., a state in which the first resist pattern forms an insolubilized resist pattern). FIG. 3 is a schematic view showing an example of the step (2) of the resist pattern-forming method according to one embodiment of the invention (i.e., a state in which the first resist pattern forms an insolubilized resist pattern). In the step (2), a resist pattern-insolubilizing resin composition is applied to the first resist pattern 1, baked or UV-cured, and washed to form an insolubilized resist pattern 3 that is insoluble in a developer and a second positive-tone radiation-sensitive resin composition (hereinafter may be referred to as "second resist material").

The insolubilizing resin composition may be applied to the first resist pattern 1 by an appropriate application method (e.g., rotational coating, cast coating, or roll coating). The insolubilizing resin composition is applied to cover the first resist pattern 1.

The insolubilizing resin composition thus applied is baked or UV-cured. The first resist pattern 1 thus reacts with the insolubilizing resin composition applied to the first resist pattern 1. The heating temperature is appropriately selected depending on the composition of the insolubilizing resin composition, but is normally 30 to 200° C., and preferably 50 to 170° C. The insolubilizing resin composition may be UV-cured using an $Ar_2$ lamp, a KrCl lamp, a $Kr_2$ lamp, an XeCl lamp, an $Xe_2$ lamp (manufactured by Ushio, Inc.), or the like.

After appropriately cooling the insolubilizing resin composition, the insolubilizing resin composition is developed in the same manner as in the step (1) to form an insoluble film 5 of the insolubilizing resin composition on the first resist pattern 1 (see FIG. 2). The insoluble film 5 is insoluble or scarcely soluble in a developer and the second resist material. After development, the insolubilized resist pattern 3 may be repeatedly cured by UV-curing or PEB, as required.

The pattern shape of the insolubilized resist pattern 3 remains even when applying the second resist material to the insolubilized resist pattern 3, and exposing and developing the resulting second resist layer. Note that the width of the pattern may change to some extent depending on the thickness of the applied insolubilizing resin composition, and the like. The step (2) may optionally be performed a plurality of times.

The insolubilized resist pattern 3 that includes third line areas 3$a$ and third space areas 3$b$ is thus formed on the substrate 10 (see FIG. 3).

3. Step (3)

Figure 4:
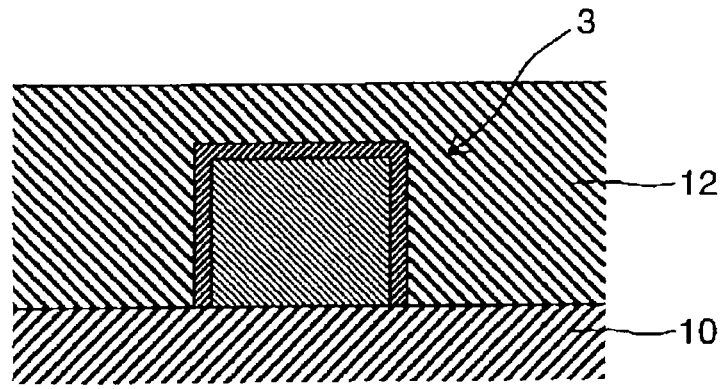
FIG. 4 is a cross-sectional view showing an example of a step (3) of a resist pattern-forming method according to one embodiment of the invention (i.e., a state in which a second resist layer is formed on an insolubilized resist pattern)

FIG. 4 is a cross-sectional view showing an example of the step (3) of the resist pattern-forming method according to one embodiment of the invention (i.e., a state in which a second resist layer is formed on the insolubilized resist pattern). In the step (3), a second resist layer 12 is formed on the substrate 10 on which the insolubilized resist pattern 3 is formed using the second resist material, and selectively exposed through a mask.

(1) Formation of Second Resist Layer

The second resist layer 12 may be formed on the substrate 10 on which the insolubilized resist pattern 3 is formed by applying the second resist material to the substrate 10 by an appropriate application method (e.g., spin coating, cast coating, or roll coating). The second resist layer 12 may optionally be prebaked (PB) in the same manner as in the step (1).

(2) Exposure

The second resist layer 12 is selectively exposed through a mask in the same manner as in the step (1) optionally together with the space areas 3$b$ of the insolubilized resist pattern 3. The second resist layer 12 may optionally be subjected to post-exposure bake (PEB).

4. Step (4)

Figure 5:
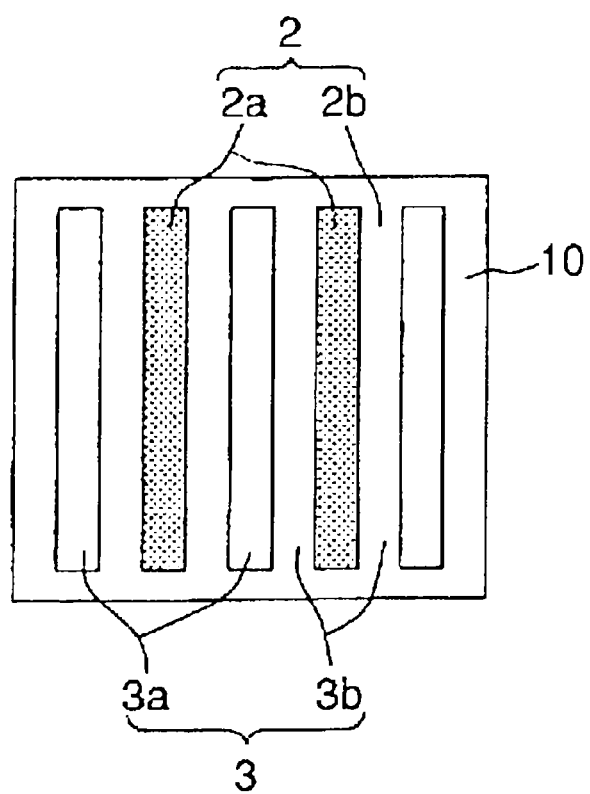
FIG. 5 is a schematic view showing an example of a step (4) of a resist pattern-forming method according to one embodiment of the invention (i.e., a state in which a second resist pattern is formed)
Figure 6:
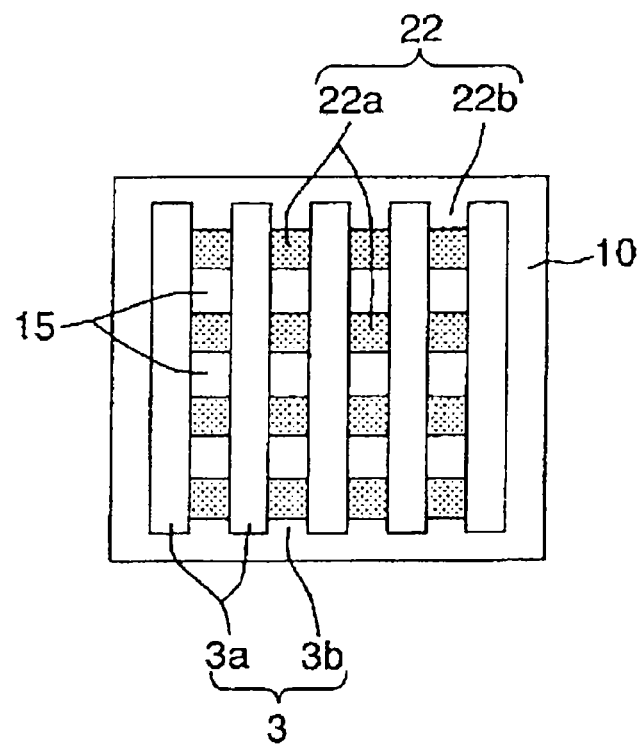
FIG. 6 is a schematic view showing another example of a step (4) of a resist pattern-forming method according to one embodiment of the invention (i.e., a state in which a second resist pattern is formed)
Figure 7:
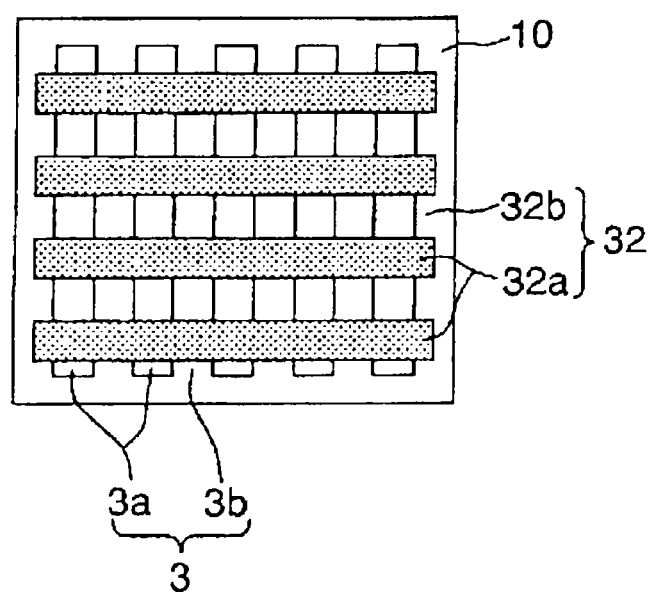
FIG. 7 is a schematic view showing still another example of a step (4) of a resist pattern-forming method according to one embodiment of the invention (i.e., a state in which a second resist pattern is formed)
Figure 8:
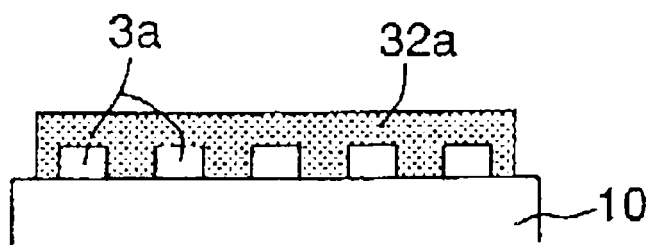
FIG. 8 is a side view showing an example of a step (4) of a resist pattern-forming method according to one embodiment of the invention (i.e., a state in which a second resist pattern is formed).

FIGS. 5 to 7 are schematic views showing an example of the step (4) of the resist pattern-forming method according to one embodiment of the invention (i.e., a state in which the second resist pattern is formed). FIG. 8 is a side view showing an example of the step (4) of the resist pattern-forming method according to one embodiment of the invention (i.e., a state in which the second resist pattern is formed). In the step (4), the second resist layer is developed to form a second resist pattern 2. The second resist layer may be developed in the same manner as in the step (1).

Various resist patterns having a specific pattern arrangement can be formed by appropriately selecting the pattern of the mask used during exposure in the step (3). As shown in FIG. 5, an insolubilized resist pattern 3 that includes third line areas 3a and third space areas 3b and a second resist pattern 2 that includes second line areas 2a and second space areas 2b can be formed in parallel on the substrate 10, for example.

As shown in FIG. 6, a resist pattern (contact hole pattern) that includes contact holes 15 defined by the third line areas 3a and the second line areas 22a can be formed by forming the second line areas 22a of the second resist pattern 22 that includes the second line areas 22a and the second space areas 22b in a grid shape in the third space areas 3b of the insolubilized resist pattern 3 that includes the third line areas 3a and the third space areas 3b, for example.

As shown in FIGS. 7 and 8, the second line areas 22a of the second resist pattern 22 that includes the second line areas 22a and the second space areas 22b may be formed over the third line areas 3a of the insolubilized resist pattern 3 that includes the third line areas 3a and the third space areas 3b so that the second line areas 22a intersect the third line areas 3a, for example.

III. Resist Material

The resist material is used to form a resist layer, and includes an acid-dissociable group-containing resin, a photoacid generator (hereinafter may be referred to as "acid generator"), and a solvent. When forming a resist layer using the resist material, the acid-dissociable group included in the resin dissociates due to an acid generated by the acid generator upon exposure, so that the solubility of the exposed area in an alkaline developer increases. Therefore, the exposed area is dissolved (removed) in an alkaline developer to obtain a positive-tone resist pattern. The first resist material used to form the first resist layer and the second resist material used to form the second resist layer may be either the same or different.

1. Acid-Dissociable Group-Containing Resin

The acid-dissociable group-containing resin preferably includes a repeating unit shown by the following general formula (8).

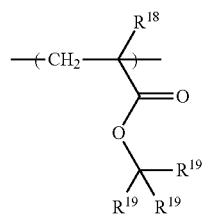

(8)

wherein $R^{18}$ represents a hydrogen atom or a methyl group, and $R^{19}$ individually represent a monovalent alicyclic hydrocarbon group having 4 to 20 carbon atoms, a derivative thereof, or a linear or branched alkyl group having 1 to 4 carbon atoms, provided that at least one of $R^{19}$ represents a monovalent alicyclic hydrocarbon group having 4 to 20 carbon atoms or a derivative thereof, or two of $R^{19}$ bond to form a divalent alicyclic hydrocarbon group having 4 to 20 carbon atoms, or a derivative thereof, together with the carbon atom that is bonded thereto, and the remaining $R^{19}$ represents a linear or branched alkyl group having 1 to 4 carbon atoms, a monovalent alicyclic hydrocarbon group having 4 to 20 carbon atoms, or a derivative thereof.

Specific examples of the group shown by "—$C(R^{19})_3$" in the general formula (8) include groups shown by the following general formulas (8a) to (8e), and a group shown by the following formula (8f).

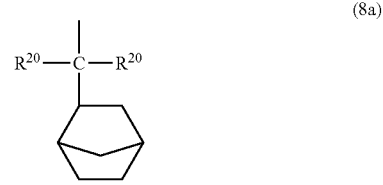

(8a)

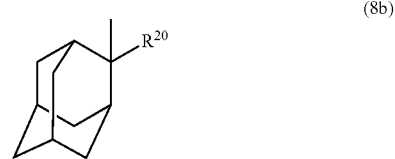

(8b)

(8c)

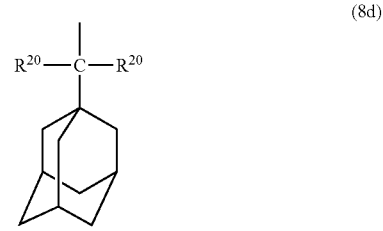

(8d)

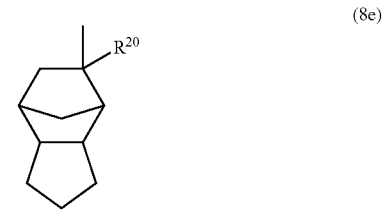

(8e)

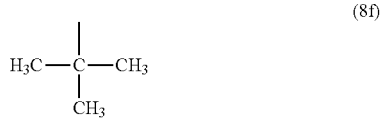

(8f)

wherein $R^{20}$ individually represent a linear or branched alkyl group having 1 to 4 carbon atoms, and m is 0 or 1.

Specific examples of the linear or branched alkyl group having 1 to 4 carbon atoms represented by $R^{20}$ in the general formulas (8a) to (8e) include a methyl group, an ethyl group, an n-propyl group, an i-propyl group, an n-butyl group, a 2-methylpropyl group, a 1-methylpropyl group, a t-butyl group, and the like. Among these, a methyl group and an ethyl group are preferable.

The group shown by "—$COOC(R^{19})_3$" in the general formula (8) dissociates due to an acid to form a carboxyl group, and serves as an alkali-soluble moiety. The term "alkali-soluble moiety" refers to a group that becomes an anion due to alkali (i.e., alkali-soluble group). The term "acid-dissociable group" refers to a group in which the alkali-soluble moiety is protected by a protecting group, and which is not alkali-soluble until the protecting group dissociates due to an acid.

The acid-dissociable group-containing resin is insoluble or scarcely soluble in alkali, but becomes alkali-soluble due to an acid. The expression "insoluble or scarcely soluble in alkali" means that a film formed only of a resin that includes a repeating unit shown by the general formula (8) has a thickness equal to or more than 50% of the initial thickness when developed under development conditions employed when forming a resist pattern using a resist layer formed of a resist material including a resin that includes a repeating unit shown by the general formula (8). The expression "alkali-soluble" means that more than 50% of the initial thickness of the film is lost when developed under the above development conditions.

(Preparation of Acid-Dissociable Group-Containing Resin)

The acid-dissociable group-containing resin may be prepared by polymerizing a monomer component that includes polymerizable unsaturated monomers corresponding to the desired repeating units in an appropriate solvent optionally in the presence of a chain transfer agent using a radical initiator (e.g., hydroperoxide, dialkyl peroxide, diacyl peroxide, or azo compound).

Examples of the solvent used for polymerization include alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, and methyl propionate; ethers such as tetrahydrofuran, dimethoxyethanes, and diethoxyethanes; alcohols such as methanol, ethanol, 1-propanol, 2-propanol, 1-butanol, 2-butanol, isobutanol, 1-pentanol, 3-pentanol, 4-methyl-2-pentanol, o-chlorophenol, and 2-(1-methylpropyl)phenol; ketones such as acetone, 2-butanone, 3-methyl-2-butanone, 4-methyl-2-pentanone, 2-heptanone, cyclopentanone, cyclohexanone, and methylcyclohexanone; and the like. These solvents may be used either individually or in combination.

The reaction temperature is normally 40 to 150° C., and preferably 50 to 120° C. The reaction time is normally 1 to 48 hours, and preferably 1 to 24 hours.

(Properties of Acid-Dissociable Group-Containing Resin)

The Mw of the acid-dissociable group-containing resin is normally 1000 to 500,000, preferably 1000 to 100,000, and still more preferably 1000 to 50,000. If the Mw of the acid-dissociable group-containing resin is less than 1000, the heat resistance of the resulting resist pattern may decrease. If the Mw of the acid-dissociable group-containing resin is more than 500,000, developability may decrease.

The ratio (Mw/Mn) of the Mw to the polystyrene-reduced number average molecular weight (Mn) of the acid-dissociable group-containing resin determined by gel permeation chromatography (GPC) is preferably 1 to 5, and more preferably 1 to 3.

It is preferable that the acid-dissociable group-containing resin have an impurity (e.g., halogen or metal) content as low as possible in order to improve the sensitivity, resolution, process stability, pattern profile, and the like. The acid-dissociable group-containing resin may be purified by chemical purification (e.g., washing with water or liquid-liquid extraction), or a combination of chemical purification and physical purification (e.g., ultrafiltration or centrifugation), for example. The content (solid content) of low-molecular-weight components containing a monomer as the main component is preferably 0.1 mass % or less based on the total amount of the acid-dissociable group-containing resin. The content of low-molecular-weight components may be determined by high-performance liquid chromatography (HPLC), for example.

2. Acid Generator

The acid generator included in the resist material generates an acid upon exposure so that the acid-dissociable group dissociates. Therefore, the exposed area of the resist layer becomes alkali-soluble to form a resist pattern.

The content of the acid generator in the resist material is normally 0.1 to 20 parts by mass, and preferably 0.5 to 10 parts by mass, based on 100 parts by mass of the acid-dissociable group-containing resin, so that the resist material exhibits excellent sensitivity and developability. If the content of the acid generator is less than 0.1 parts by mass, the sensitivity and the developability of the resist material may decrease. If the content of the acid generator is more than 20 parts by mass, it may be difficult to form a rectangular resist pattern due to a decrease in transparency to radiation.

The acid generator preferably includes an acid generator having a structure shown by the following general formula (9). The acid generator may also include an acid generator (hereinafter referred to as "additional acid generator") other than the acid generator having a structure shown by the general formula (9).

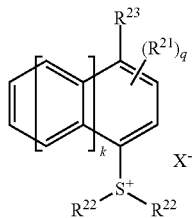

(9)

wherein $R^{21}$ represents a linear or branched alkyl group having 1 to 10 carbon atoms, an alkoxy group, or a linear, branched, or cyclic alkanesulfonyl group having 1 to 10 carbon atoms, $R^{22}$ individually represent a linear or branched alkyl group having 1 to 10 carbon atoms, a substituted or unsubstituted phenyl group, or a substituted or unsubstituted naphthyl group, or bond to form a substituted or unsubstituted divalent group having 2 to 10 carbon atoms that includes the sulfur cation, $R^{23}$ represents a hydrogen atom, a fluorine atom, a hydroxyl group, a linear or branched alkyl group having 1 to 10 carbon atoms, a linear or branched alkoxy group having 1 to 10 carbon atoms, or a linear or branched alkoxycarbonyl group having 2 to 11 carbon atoms, k is an integer from 0 to 2, q is an integer from 0 to 10 (preferably an integer from 0 to 2), and $X^-$ represents one of anions shown by the following general formulas (10-1) to (10-4).

(10-1)

(10-2)

(10-3)

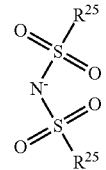

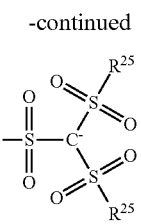

(10-4)

wherein $R^{24}$ represents a fluorine atom or a substituted or unsubstituted hydrocarbon group having 1 to 12 carbon atoms, q is an integer from 1 to 10, and $R^{25}$ individually represent a linear or branched alkyl group having 1 to 10 carbon atoms that is substituted with a fluorine atom, or bond to form a divalent organic group having 2 to 10 carbon atoms that is substituted with a fluorine atom and may include a substituent other than a fluorine atom.

The acid generators having a structure shown by the general formula (9) may be used either individually or in combination.

(Additional Acid Generator)

Examples of the additional acid generator include onium salt compounds, halogen-containing compounds, diazoketone compounds, sulfone compounds, sulfonic acid compounds, and the like. These additional acid generators may be used either individually or in combination.

The content of the additional acid generator is normally 80 mass % or less, and preferably 60 mass % or less, based on the total amount (=100 mass %) of the acid generator.

3 Solvent

The resist material is preferably a solution prepared by dissolving the acid-dissociable group-containing resin, the acid generator, and the like in a solvent. In this case, a uniform film can be formed.

The solvent is normally used in such an amount that the resist material has a solid content of 2 to 70 mass %, preferably 4 to 25 mass %, and more preferably 4 to 10 mass %.

The solvent is preferably at least one solvent selected from the group consisting of propylene glycol monomethyl ether acetate, 2-heptanone, and cyclohexanone (hereinafter referred to as "solvent (1)"). A solvent (hereinafter referred to as "additional solvent") other than the solvent (1) may also be used. It is also possible to use the solvent (1) and the additional solvent in combination.

(Additional Solvent)

Examples of the additional solvent include propylene glycol monoalkyl ether acetates such as propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; linear or branched ketones such as 2-butanone, 2-pentanone, 3-methyl-2-butanone, 2-hexanone, 4-methyl-2-pentanone, 3-methyl-2-pentanone, 3,3-dimethyl-2-butanone, and 2-octanone; cyclic ketones such as cyclopentanone, 3-methylcyclopentanone, 2-methylcyclohexanone, 2,6-dimethylcyclohexanone, and isophorone; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methyl propionate, ethoxyethyl acetate, ethyl hydroxyacetate, methyl 2-hydroxy-3-methylbutyrate, 3-methoxybutylacetate, 3-methyl-3-methoxybutylacetate, 3-methyl-3-methoxybutylpropionate, 3-methyl-3-methoxybutylbutyrate, ethyl acetate, n-propyl acetate, n-butyl acetate, methyl acetoacetate, ethyl acetoacetate, methyl pyruvate, ethyl pyruvate, N-methyl pyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and the like.

Among these, linear or branched ketones, cyclic ketones, propylene glycol monoalkyl ether acetates, alkyl 2-hydroxypropionates, alkyl 3-alkoxypropionates, γ-butyrolactone, and the like are preferable. These additional solvents may be used either individually or in combination.

When using the solvent (1) and the additional solvent in combination, the additional solvent is normally used in an amount of 50 mass % or less, preferably 30 mass % or less, and still more preferably 25 mass % or less, based on the total amount (=mass %) of the solvents.

4 Acid Diffusion Controller

It is preferable that the resist material include an acid diffusion controller. The acid diffusion controller controls diffusion of an acid generated from the acid generator upon exposure within the resist layer, and suppresses undesired chemical reactions in the unexposed area. The acid diffusion controller improves the storage stability of the resist material and the resolution of the resist. Moreover, a change in line width of the resist pattern due to a change in post-exposure delay (PED) can be prevented, so that a resist material with excellent process stability can be obtained.

The acid diffusion controller is normally used in an amount of 15 parts by mass or less, preferably 10 parts by mass or less, and still more preferably 5 parts by mass or less, based on 100 parts by mass of the acid-dissociable group-containing resin. If the amount of the acid diffusion controller is more than 15 parts by mass, the sensitivity of the resist material may decrease. If the amount of the acid diffusion controller is less than 0.001 parts by mass, the shape or the dimensional accuracy of the resist pattern may deteriorate depending on the process conditions.

A nitrogen-containing organic compound or a photodegradable base is preferably used as the acid diffusion controller. The acid diffusion controllers may be used either individually or in combination.

(Nitrogen-Containing Organic Compound)

Examples of the nitrogen-containing organic compound include a compound shown by the following general formula (11) (hereinafter referred to as "nitrogen-containing compound (1)"), a compound that includes two nitrogen atoms in the molecule (hereinafter referred to as "nitrogen-containing compound (2)"), a polyamino compound that includes three or more nitrogen atoms in the molecule and a polymer thereof (hereinafter collectively referred to as "nitrogen-containing compound (3)"), amide group-containing compounds, urea compounds, nitrogen-containing heterocyclic compounds, and the like.

(11)

wherein $R^{26}$ individually represent a hydrogen atom, a substituted or unsubstituted linear, branched, or cyclic alkyl group, a substituted or unsubstituted aryl group, or a substituted or unsubstituted aralkyl group.

Examples of a preferable nitrogen-containing compound (1) include mono(cyclo)alkylamines such as n-hexylamine, n-heptylamine, n-octylamine, n-nonylamine, n-decylamine, and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, cyclohexylmethylamine, and dicyclohexylamine; tri(cyclo) alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine; and substituted alkylamines such as 2,2',2"-nitrotriethanol; and aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, 2,4,6-tri-tert-butyl-N-methylaniline, N-phenyldiethanolamine, and 2,6-diisopropylaniline.

Examples of a preferable nitrogen-containing compounds (2) include ethylenediamine, N,N,N',N'-tetramethylethylenediamine, tetramethylenediamine, hexamethylenediamine, 4,4'-diaminodiphenylmethane, 4,4'-diamino diphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 1,4-bis[1-(4-aminophenyl)-1-methylethyl]benzene, 1,3-bis[1-(4-aminophenyl)-1-methylethyl]benzene, bis(2-dimethylaminoethyl) ether, bis (2-diethylaminoethyl) ether, 1-(2-hydroxyethyl)-2-imidazolizinone, 2-quinoxalinol, N,N,N',N'-tetrakis(2-hydroxypropyl)ethylenediamine, N,N,N',N",N"-pentamethyldiethylenetriamine, and the like.

Examples of a preferable nitrogen-containing compound (3) include polyethyleneimine, polyallylamine, a polymer of 2-dimethylaminoethylacrylamide, and the like.

Examples of a preferable amide group-containing compound include N-t-butoxycarbonyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N'-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, and N-t-butoxycarbonylpyrrolidine; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanuric acid, and the like.

Examples of a preferable urea compound include urea, methylurea, 1,1-dimethylurea, 1,3-dimethylurea, 1,1,3,3-tetramethylurea, 1,3-diphenylurea, tri-n-butylthiourea, and the like. Examples of a preferable nitrogen-containing heterocyclic compound include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 4-hydroxyquinoline, 8-oxyquinoline, acridine, and 2,2':6',2"-terpyridine; piperazines such as piperazine and 1-(2-hydroxyethyl)piperazine; and pyrazine, pyrazole, pyridazine, quinoxaline, purine, pyrrolidine, piperidine, piperidineethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

(Photodegradable Base)

The photodegradable base is an onium salt compound that exhibits acid diffusion controllability upon decomposition due to exposure. Specific examples of the photodegradable base include a sulfonium salt compound shown by the following general formula (12) and an iodonium salt compound shown by the following general formula (13).

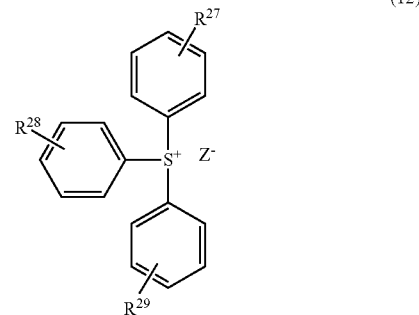

(12)

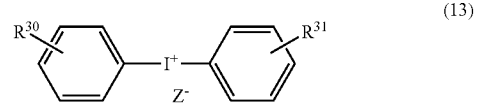

(13)

wherein $R^{27}$ to $R^{29}$, $R^{30}$, and $R^{31}$ individually represent a hydrogen atom, an alkyl group, an alkoxy group, a hydroxyl group, or a halogen atom, and $Z^-$ represents $OH^-$, $R^{32}$—$COO^-$, $R^{32}$—$SO_3^-$ (wherein $R^{32}$ represents an alkyl group, an aryl group, or an alkaryl group), or an anion shown by the following general formula (14).

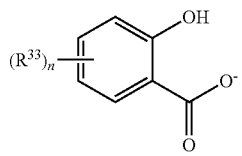

(14)

wherein $R^{33}$ represents a linear or branched alkyl group having 1 to 12 carbon atoms that may be substituted with a fluorine atom, or a linear or branched alkoxy group having 1 to 12 carbon atoms, and n is 1 or 2.

5 Additive

The resist material may optionally include additives such as a surfactant, a sensitizer, and an aliphatic additive.

(Surfactant)

The surfactant improves the applicability, striation, developability, and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as KP341 (manufactured by Shin-Etsu Chemical Co., Ltd.), Polyflow No. 75, Polyflow No. 95 (manufactured by Kyoeisha Chemical Co., Ltd.), EFTOP EF301, EFTOP EF303, EFTOP EF352 (manufactured by JEMCO, Inc.), Megafac F171, Megafac F173 (manufactured by DIC Corporation), Fluorad FC430, Fluorad FC431 (manufactured by Sumitomo 3M Ltd.), Asahi Guard AG710, Surflon S-382, Surflon SC-101, Surflon SC-102, Surflon SC-103, Surflon SC-104, Surflon SC-105, Surflon SC-106 (manufactured by Asahi Glass Co., Ltd.); and the like. These surfactants may be used either individually or in combination. The surfactant is normally used in an amount of 2 parts by mass or less based on 100 parts by mass of the acid-dissociable group-containing resin.

(Sensitizer)

The sensitizer absorbs the energy of radiation, and transmits the absorbed energy to the acid generator so that the amount of acid generated by the acid generator increases. The sensitizer improves the apparent sensitivity of the resist material. Examples of the sensitizer include carbazoles, acetophenones, benzophenones, naphthalenes, phenols, biacetyl, eosine, rose bengal, pyrenes, anthracenes, phenothiazines, and the like. These sensitizers may be used either individually or in combination. The sensitizer is normally used in an amount of 50 parts by mass or less based on 100 parts by mass of the acid-dissociable group-containing resin.

(Alicyclic additive)

The alicyclic additive further improves the dry etching resistance, the pattern shape, adhesion to a substrate, and the like. Examples of the alicyclic additive include alicyclic additives including an acid-dissociable group, alicyclic additives that do not include an acid-dissociable group, and the like. Specific examples of the alicyclic additive include adamantane derivatives such as 1-adamantanecarboxylic acid, 2-adamantanone, t-butyl-1-adamantanecarboxylate, t-butoxycarbonylmethyl 1-adamantanecarboxylate, α-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; 3-(2-hydroxy-2,2-bis(trifluoromethyl)ethyptetracyclo[6.2.1.1$^{3,6}$.0$^{2,7}$]dodecane; and the like.

These alicyclic additives may be used either individually or in combination. The alicyclic additive is normally used in an amount of 50 parts by mass or less, and preferably 30 parts by mass or less, based on 100 parts by mass of the acid-dissociable group-containing resin. If the amount of the alicyclic additive is more than 50 parts by mass, the heat resistance of the resulting resist may decrease. Examples of other additives include a dye or a pigment that visualizes a latent image in the exposed area to reduce the effects of halation during exposure, an adhesion improver that improves adhesion to a substrate, an alkali-soluble resin, a low-molecular-weight alkali solubility controller that includes an acid-dissociable protecting group, a halation inhibitor, a preservative, an antifoaming agent, and the like.

The resist material may be prepared by dissolving each component in the solvent, and filtering the solution through a filter having a pore size of about 0.2 μm, for example. The resist material thus prepared may be applied to a substrate.

The embodiments of the invention are further described below by way of examples. Note that the embodiments of the invention are not limited to the following examples. In the examples, the unit "parts" refers to "parts by mass", and the unit "%" refers to "mass %", unless otherwise indicated. The property measurement methods and the property evaluation methods employed in the examples and comparative examples are given below.

Weight average molecular weight (Mw) and number average molecular weight (Mn): The weight average molecular weight (Mw) and the number average molecular weight (Mn) were measured by gel permeation chromatography (GPC) using GPC columns manufactured by Tosoh Corp. (G2000HXL×2, G3000HXL×1, G4000HXL×1) (flow rate: 1.0 ml/min, eluant: tetrahydrofuran, column temperature: 40° C., standard: monodisperse polystyrene). The dispersity (Mw/Mn) was calculated from the Mw and Mn measurement results.

Low-molecular-weight component residual rate (%): The low-molecular-weight component residual rate was determined by high-performance liquid chromatography (HPLC) using an Intersil ODS-25 μm column (4.6 mm (diameter)× 250 mm) (manufactured by GL Sciences Inc.) (flow rate: 1.0 ml/min, eluant: acrylonitrile/0.1% phosphoric acid aqueous solution). The low-molecular-weight components are components (mainly monomers) having a molecular weight of less than 1000 (preferably components having a molecular weight equal to or lower than that of trimers).

$^{13}$C-NMR analysis: Each polymer was subjected to $^{13}$C-NMR analysis (solvent: CDCL$_3$) using an instrument "JNM-EX270" (manufactured by JEOL Ltd.).

Evaluation of pattern: The pattern was evaluated using a scanning electron microscope ("S-9380" manufactured by Hitachi High-Technologies Corporation). When evaluating the insolubilized resist pattern formed on the evaluation substrate B, a case where the first resist pattern remained was evaluated as "Good", and a case where the first resist pattern was lost was evaluated as "Bad". When evaluating the second resist pattern formed on the evaluation substrate C, a case where a 50 nm line/100 nm pitch (50 nm 1L/1S) line-and-space pattern could be formed within the space area of the insolubilized resist pattern formed on the evaluation substrate B was evaluated as "Good", and a case where (i) the insolubilized resist pattern was lost, (ii) the second resist pattern was not formed, or (iii) the second resist pattern was formed, but the insolubilized resist pattern remained undissolved was evaluated as "Bad". A case where a 90 nm hole/240 nm pitch contact hole pattern (see FIG. 6) was formed was evaluated as "Good (hole)".

Evaluation of change in CD: A case where a change in line width of the insolubilized resist pattern when forming the evaluation substrate C was 2 nm or less was evaluated as "Excellent", a case where a change in line width was 6 nm or less was evaluated as "Good", a case where a change in line width was 7 nm or more was evaluated as "Fair", and a case where a change in line width was 10 nm or more was evaluated as "Bad".

Synthesis Example 1

Polymer (A-1)

53.93 g (50 mol %) of the compound shown by the following formula (L-1), 10.69 g (10 mol %) of the compound shown by the following formula (L-2), and 35.38 g (40 mol %) of the compound shown by the following formula (L-3) were dissolved in 200 g of 2-butanone. 5.58 g of dimethyl 2,2'-azobis(2-methylpropionate) was added to the solution to prepare a monomer solution. A three-necked flask (1000 ml) was charged with 100 g of 2-butanone, purged with nitrogen for 30 minutes, and heated to 80° C. with stirring. The monomer solution prepared as described above was added dropwise to the flask using a dropping funnel over three hours. The monomers were polymerized for six hours from the start of addition of the monomer solution. After completion of polymerization, the polymer solution was cooled with water to 30° C. or less, and added to 2000 g of methanol. A white powdery precipitate was collected by filtration. The white powder thus collected was washed twice with 400 g of methanol in a slurry state, collected by filtration, and dried at 50° C. for 17 hours to obtain a white powdery polymer (A-1) (74 g, yield: 74%). The polymer (A-1) had an Mw of 6900, a dispersity (Mw/Mn) of 1.70, and a low-molecular-weight component residual rate of 0.03%. As a result of $^{13}$C-NMR analysis, the polymer (A-1) was found to contain the repeating units shown by the following formula (A-1). The content (mol %) of the repeating units was a/b/c=53.0/9.8/37.2.

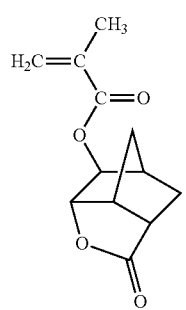

(L-1)

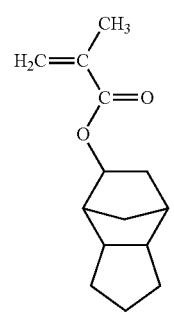

(L-2)

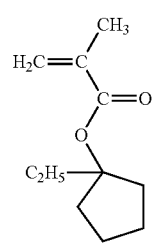

(L-3)

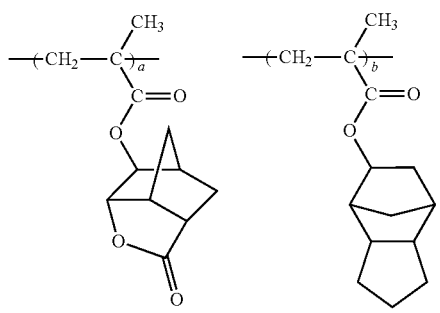

(A-1)

Synthesis Example 2

Polymer (A-2)

A polymer (A-2) was obtained in the same manner as in Synthesis Example 1, except for using 39.14 g (37 mol %) of the compound shown by the following formula (L-4) instead of the compound shown by the formula (L-2), and using 50.16 g (50 mol %) of the compound shown by the formula (L-1) and 10.70 g (13 mol %) of the compound shown by the formula (L-3) (78 g, yield: 78%). The polymer (A-2) had an Mw of 5200, a dispersity (Mw/Mn) of 1.62, and a low-molecular-weight component residual rate of 0.03%. As a result of $^{13}$C-NMR analysis, the polymer (A-2) was found to contain the repeating units shown by the following formula (A-2). The content (mol %) of the repeating units was a/b/c=50.0/37.0/13.0.

(L-4)

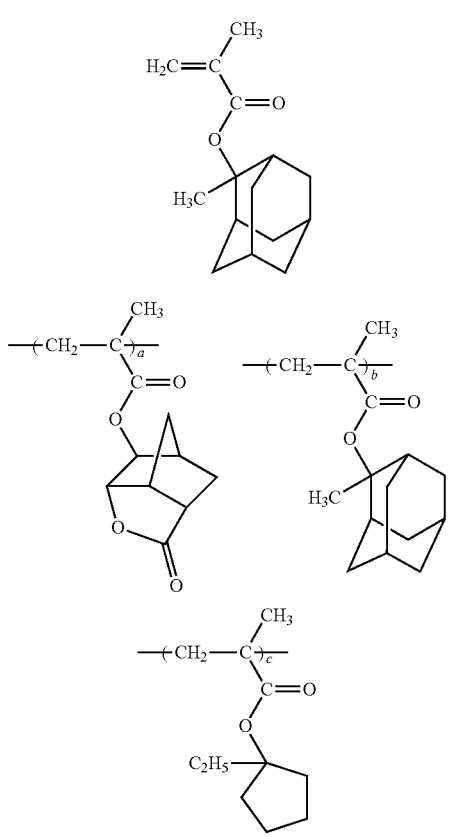

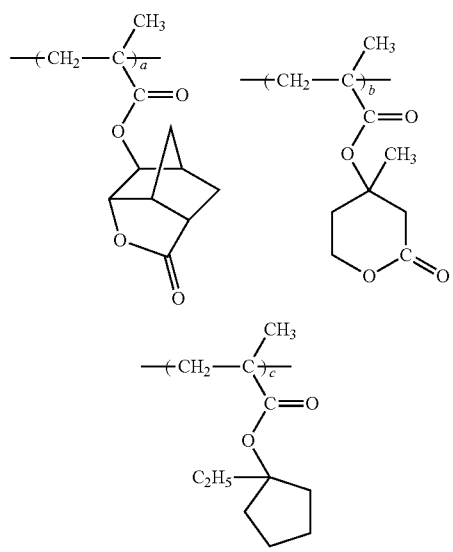

Synthesis Example 3

Polymer (A-3)

A polymer (A-3) was obtained in the same manner as in Synthesis Example 1, except for using 9.72 g (10 mol %) of the compound shown by the following formula (L-5) instead of the compound shown by the formula (L-2), and using 54.51 g (50 mol %) of the compound shown by the formula (L-1) and 35.76 g (40 mol %) of the compound shown by the formula (L-3) (71 g, yield: 71%). The polymer (A-3) had an Mw of 8100, a dispersity (Mw/Mn) of 1.69, and a low-molecular-weight component residual rate of 0.04%. As a result of $^{13}$C-NMR analysis, the polymer (A-2) was found to contain the repeating units shown by the following formula (A-3). The content (mol %) of the repeating units was a/b/c=53 0.6/9.8/36.6.

Synthesis Example 4

Polymer (A-4)

A polymer (A-4) was obtained in the same manner as in Synthesis Example 1, except for using 24.42 g (15 mol %) of the compound shown by the following formula (L-6) instead of the compound shown by the formula (L-2), using 30.40 g (40 mol %) of the compound shown by the following formula (L-7) instead of the compound shown by the formula (L-3), and using 45.18 g (45 mol %) of the compound shown by the formula (L-1) (75 g, yield: 75%). The polymer (A-4) had an Mw of 6100, a dispersity (Mw/Mn) of 1.73, and a low-molecular-weight component residual rate of 0.04%. As a result of $^{13}$C-NMR analysis, the polymer (A-4) was found to contain the repeating units shown by the following formula (A-4). The content (mol %) of the repeating units was a/b/c=44.1/15.5/40.4.

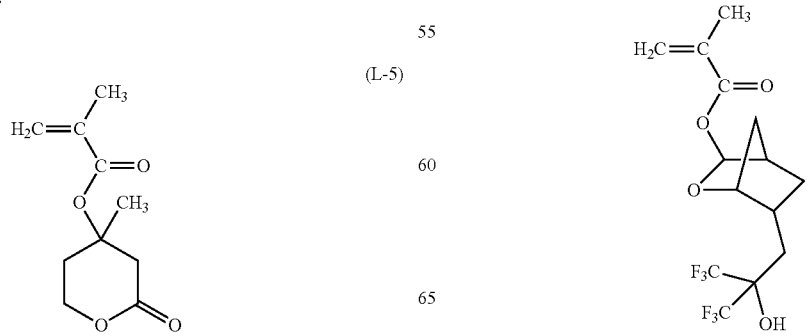

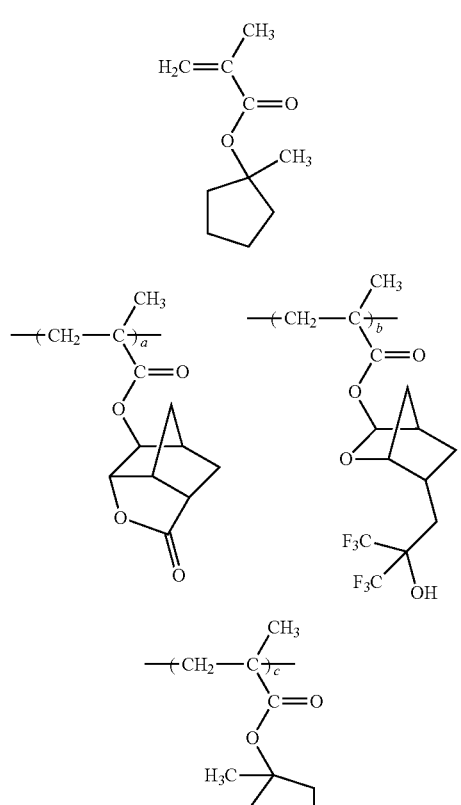

(L-7)

(A-4)

Synthesis Example 5

Polymer (A-5)

A polymer (A-5) was obtained in the same manner as in Synthesis Example 1, except for using 35.6 g (35 mol %) of the compound shown by the formula (L-4) instead of the compound shown by the formula (L-2), using 16.17 g (15 mol %) of the compound shown by the following formula (L-8) instead of the compound shown by the formula (L-3), and using 48.23 g (50 mol %) of the compound shown by the formula (L-1) (72 g, yield: 72%). The polymer (A-5) had an Mw of 8200, a dispersity (Mw/Mn) of 1.78, and a low-molecular-weight component residual rate of 0.03%. As a result of $^{13}$C-NMR analysis, the polymer (A-5) was found to contain the repeating units shown by the following formula (A-5). The content (mol %) of the repeating units was a/b/c-50.0/36.9/13.1.

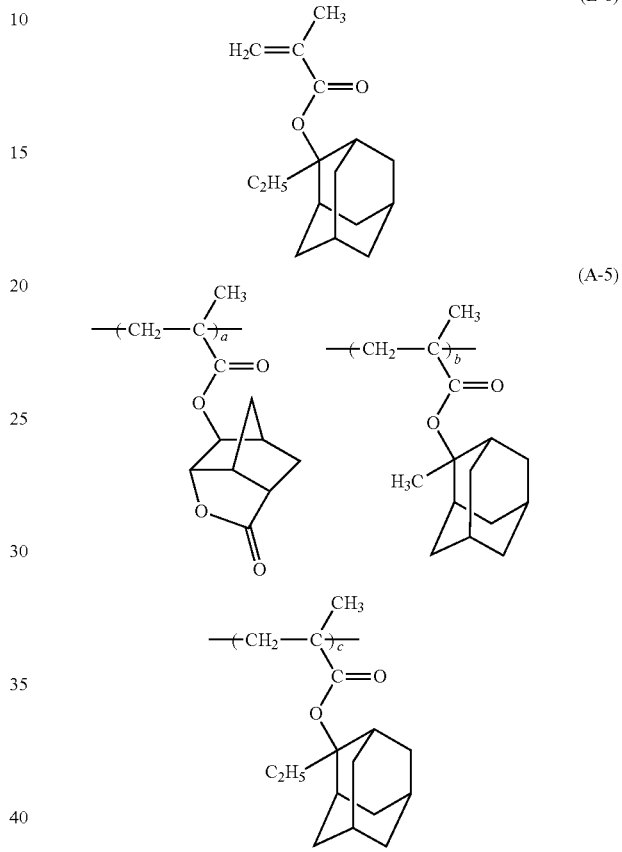

(L-8)

(A-5)

(Preparation of Positive-Tone Resist Material)

First resist materials (1) to (7) and second resist materials (8) to (12) were prepared using the polymers prepared in Synthesis Examples 1 to 5, an acid generator, an acid diffusion controller, and a solvent in amounts shown in Table 1.

TABLE 1

| Resist material Type | | Polymer | | Acid generator | | Acid diffusion controller | | Solvent | |
|---|---|---|---|---|---|---|---|---|---|
| | | Type | Amount (parts) | Type | Amount (parts) | Type | Amount (parts) | Type | Amount (parts) |
| First resist material | 1 | A-1 | 100 | D-1 | 6 | E-1 | 0.5 | F-1 | 1420 |
| | | | | D-2 | 1 | | | F-2 | 30 |
| | 2 | A-2 | 100 | D-1 | 6 | E-1 | 0.5 | F-1 | 1420 |
| | | | | D-2 | 1 | | | F-2 | 30 |
| | 3 | A-3 | 100 | D-1 | 6 | E-1 | 0.5 | F-1 | 1420 |
| | | | | D-2 | 1 | | | F-2 | 30 |
| | 4 | A-5 | 100 | D-1 | 6 | E-1 | 0.5 | F-1 | 1420 |
| | | | | D-2 | 1 | | | F-2 | 30 |
| | 5 | A-1 | 100 | D-1 | 6 | E-2 | 3 | F-1 | 1420 |
| | | | | D-2 | 1 | | | F-2 | 30 |
| | 6 | A-2 | 100 | D-1 | 6 | E-1 | 0.5 | F-1 | 1420 |
| | | | | D-3 | 1 | | | F-2 | 30 |
| | 7 | A-2 | 100 | D-1 | 6 | E-1 | 0.5 | F-1 | 1420 |
| | | | | D-4 | 1 | | | F-2 | 30 |

TABLE 1-continued

| Resist material Type | | Polymer | | Acid generator | | Acid diffusion controller | | Solvent | |
|---|---|---|---|---|---|---|---|---|---|
| | | Type | Amount (parts) | Type | Amount (parts) | Type | Amount (parts) | Type | Amount (parts) |
| Second resist material | 8 | A-4 | 100 | D-1 | 7 | E-2 | 2 | F-1 | 1420 |
| | | | | | | | | F-2 | 30 |
| | 9 | A-4 | 100 | D-2 | 7 | E-3 | 3 | F-1 | 1420 |
| | | | | | | | | F-2 | 30 |
| | 10 | A-4 | 100 | D-2 | 7 | E-1 | 0.2 | F-1 | 1420 |
| | | | | | | E-2 | 1 | F-2 | 30 |
| | 11 | A-4 | 100 | D-2 | 7 | E-1 | 0.5 | F-1 | 1420 |
| | | | | | | | | F-2 | 30 |
| | 12 | A-2 | 100 | D-2 | 7 | E-2 | 3 | F-1 | 1420 |
| | | | | | | | | F-2 | 30 |

The acid generator, the acid diffusion controller, and the solvent shown in Table 1 are as follows.
(Acid generator)
(D-1): 4-nonafluoro-n-butylsulfonyloxyphenyl·diphenylsulfonium nonafluoro-n-butanesulfonate
(D-2): triphenylsulfonium nonafluoro-n-butanesulfonate
(D-3): triphenylsulfonium 2-bicyclo[2.2.1]hept-2-yl-1,1,2,2-tetrafluoroethanesulfonate
(D-4): triphenylsulfonium 2-bicyclo[2.2.1]heptan-2-yl-1,1-difluoroethanesulfonate
(Acid diffusion controller)
(E-1): (R)-(+)-1-(t-butoxycarbonyl)-2-pyrrolidinemethanol N-t-butoxycarbonylpyrrolidine
(E-2): triphenylsulfonium salicylate
(E-3): triphenylsulfonium 10-camphorsulfonate
(Solvent)
(F-1): propylene glycol monoethyl ether acetate
(F-2): γ-butyrolactone

Synthesis Example 6

Polymer (B-1)

25.34 g of p-hydroxymethacrylanilide (hereinafter referred to as "(m-1)"), 18.68 g of 2-(((trifluoromethyl)sulfonyl)amino)ethyl-1-methacrylate (hereinafter referred to as "(m-3)"), 5.99 g of the monomer shown by the following formula (m-4) (hereinafter referred to as "(m-4)"), and 3.13 g of azobisisobutyronitrile (hereinafter referred to as "AIBN") were dissolved in 150 g of isopropyl alcohol (hereinafter referred to as "IPA"). The monomers were polymerized under reflux conditions (82° C.) for six hours. After cooling the reaction vessel with running water, 100 g of ethyl acetate, 70 g of IPA, and 70 g of methanol were added to the polymer solution to obtain a homogenous solution. After the addition of 300 g of water, the mixture was allowed to stand for one hour. A viscous polymer that had precipitated in the lower layer was collected, and dried at 50° C. under vacuum to obtain a polymer (B-1) (yield: 60%). The polymer (B-1) had an Mw of 8000 and a dispersity (Mw/Mn) of 1.55. As a result of $^{13}$C-NMR analysis, the content (mol %) ratio of the repeating units in the polymer (B-1) was (m-1)/(m-3)/(m-4)=54.5/36.0/9.5. The polymer (B-1) is referred to as "resin (B-1)".

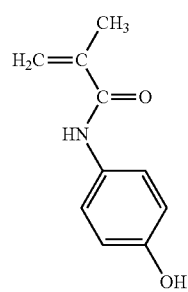

(m-1)

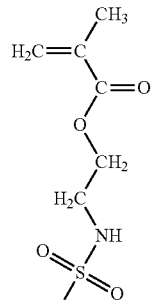

(m-3)

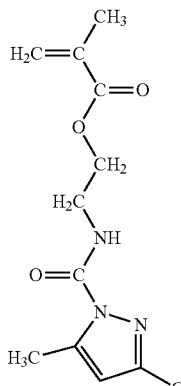

(m-4)

Synthesis Example 7

Polymer (B-2)

26.41 g of (m-1), 4.38 g of p-t-butoxystyrene (hereinafter referred to as "(m-2)"), 12.98 g of (m-3), 6.24 g of (m-4), and 3.26 g of AIBN were dissolved in 150 g of IPA. The monomers were polymerized under reflux conditions (82° C.) for six hours. After cooling the reaction vessel with running water, 100 g of ethyl acetate, 70 g of IPA, and 70 g of methanol were added to the polymer solution to obtain a homogenous solution. After the addition of 300 g of water, the mixture was allowed to stand for one hour. A viscous polymer that had precipitated in the lower layer was collected, and dried at 50° C. under vacuum to obtain a polymer (B-2) (yield: 68%). The polymer (B-2) had an Mw of 7800 and a dispersity (Mw/Mn) of 1.53. As a result of $^{13}$C-NMR analysis, the content (mol %) ratio of the repeating units in the polymer (B-2) was (m-1)/(m-2)/(m-3)/(m-4)=54.2/14.5/18.5/12.8. The polymer (B-2) is referred to as "resin (B-2)".

Synthesis Example 8

Polymer (B-3)

24.95 g of (m-1), 17.37 g of (m-2), 3.68 g of (m-3), 4.00 g of glycidyl methacrylate (hereinafter referred to as "(m-5)"), and 3.70 g of AIBN were dissolved in 150 g of IPA. The monomers were polymerized under reflux conditions (82° C.) for six hours. After cooling the reaction vessel with running water, 100 g of ethyl acetate, 70 g of IPA, and 70 g of methanol were added to the polymer solution to obtain a homogenous solution. After the addition of 300 g of water, the mixture was allowed to stand for one hour. A viscous polymer that had precipitated in the lower layer was collected, and dried at 50° C. under vacuum to obtain a polymer (B-3) (yield: 68%). The polymer (B-3) had an Mw of 8200 and a dispersity (Mw/Mn) of 1.61. As a result of $^{13}$C-NMR analysis, the content (mol %) ratio of the repeating units in the polymer (B-3) was (m-1)/(m-2)/(m-3)/(m-5)=45.2/40.5/4.5/9.8. The polymer (B-3) is referred to as "resin (B-3)".

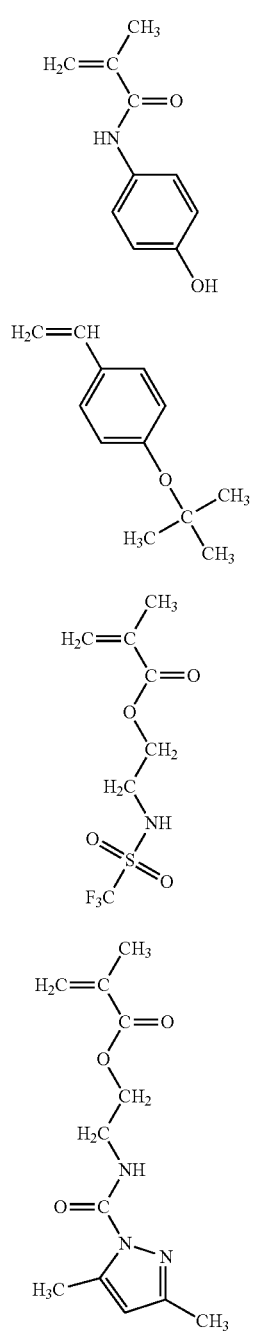

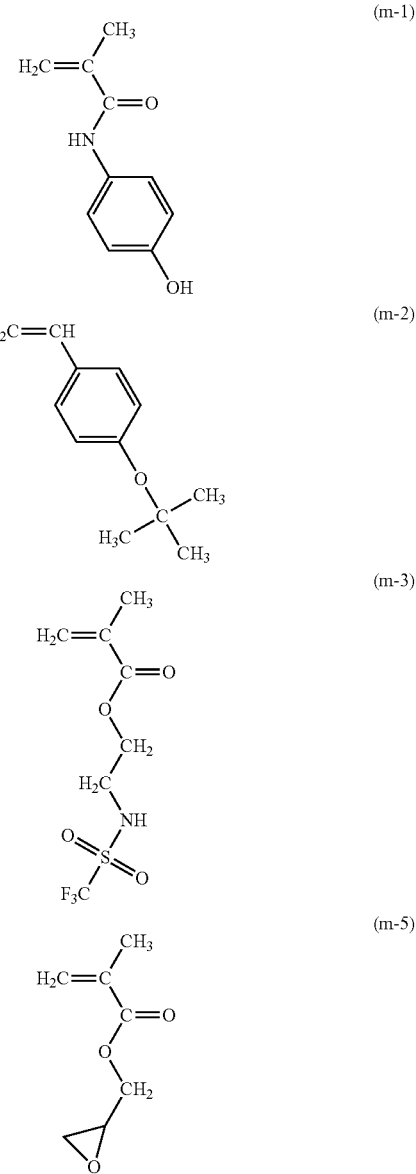

Synthesis Example 9

Polymer (B-4)

25.56 g of (m-1), 20.34 g of (m-2), 4.10 g of (m-5), and 3.79 g of AIBN were dissolved in 150 g of IPA. The monomers were polymerized under reflux conditions (82° C.) for six hours. After cooling the reaction vessel with running water, 100 g of ethyl acetate, 70 g of IPA, and 70 g of methanol were added to the polymer solution to obtain a homogenous solution. After the addition of 300 g of water, the mixture was allowed to stand for one hour. A viscous polymer that had precipitated in the lower layer was collected, and dried at 50° C. under vacuum to obtain a polymer (B-4) (yield: 70%). The polymer (B-4) had an Mw of 8000 and a dispersity (Mw/Mn) of 1.62. As a result of $^{13}$C-NMR analysis, the content (mol %) ratio of the repeating units in the polymer (B-4) was (m-1)/(m-2)/(m-5)=45.5/45.5/9.0. The polymer (B-4) is referred to as "resin (B-4)".

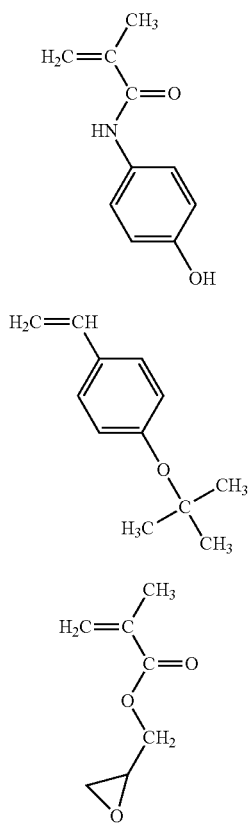

Synthesis Example 10

Polymer (B-5)

30.66 g of (m-1), 15.25 g of (m-2), 4.10 g of (m-5), and 3.70 g of AIBN were dissolved in 150 g of IPA. The monomers were polymerized under reflux conditions (82° C.) for six hours. After cooling the reaction vessel with running water, 100 g of ethyl acetate, 70 g of IPA, and 70 g of methanol were added to the polymer solution to obtain a homogenous solution. After the addition of 300 g of water, the mixture was allowed to stand for one hour. A viscous polymer that had precipitated in the lower layer was collected, and dried at 50° C. under vacuum to obtain a polymer (B-5) (yield: 68%). The polymer (B-5) had an Mw of 8200 and a dispersity (Mw/Mn) of 1.50. As a result of $^{13}$C-NMR analysis, the content (mol %) ratio of the repeating units in the polymer (B-5) was (m-1)/(m-2)/(m-5)=55.2/35.5/9.3. The polymer (B-5) is referred to as "resin (B-5)".

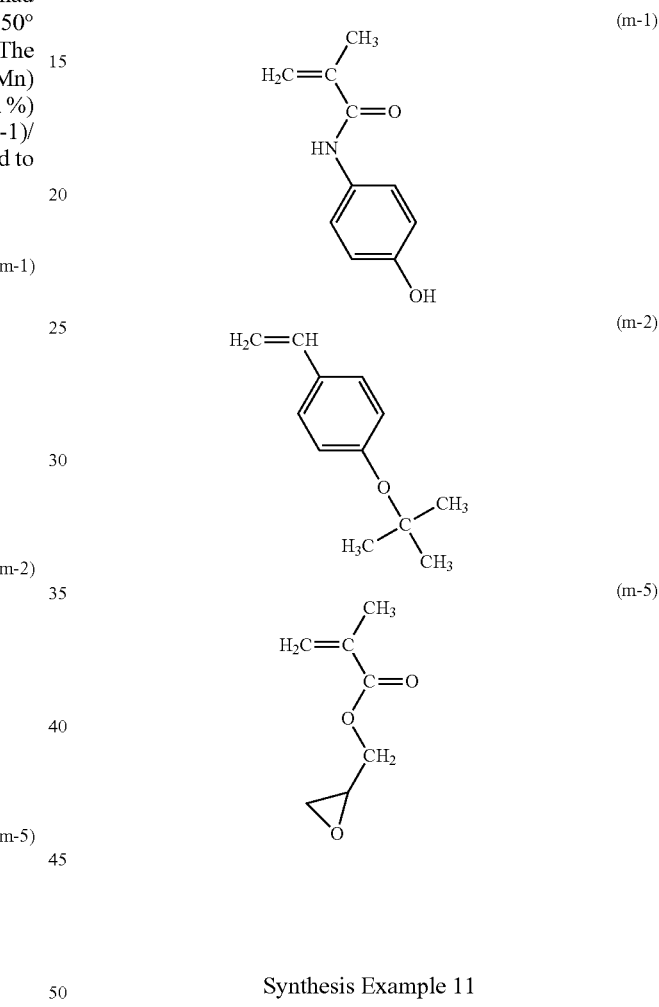

Synthesis Example 11

Polymer (B-6)

29.93 g of (m-1), 14.88 g of (m-2), 5.19 g of the monomer shown by the following formula (m-6) (hereinafter referred to as "(m-6)"), and 3.70 g of AIBN were dissolved in 150 g of IPA. The monomers were polymerized under reflux conditions (82° C.) for six hours. After cooling the reaction vessel with running water, 100 g of ethyl acetate, 70 g of IPA, and 70 g of methanol were added to the polymer solution to obtain a homogenous solution. After the addition of 300 g of water, the mixture was allowed to stand for one hour. A viscous polymer that had precipitated in the lower layer was collected, and dried at 50° C. under vacuum to obtain a polymer (B-6) (yield: 60%). The polymer (B-6) had an Mw of 7800 and a dispersity (Mw/Mn) of 1.55. As a result of $^{13}$C-NMR analysis, the content (mol %) ratio of the repeating units in the polymer (B-6) was (m-1)/(m-2)/(m-6)=55.2/35.5/9.3. The polymer (B-6) is referred to as "resin (B-6)".

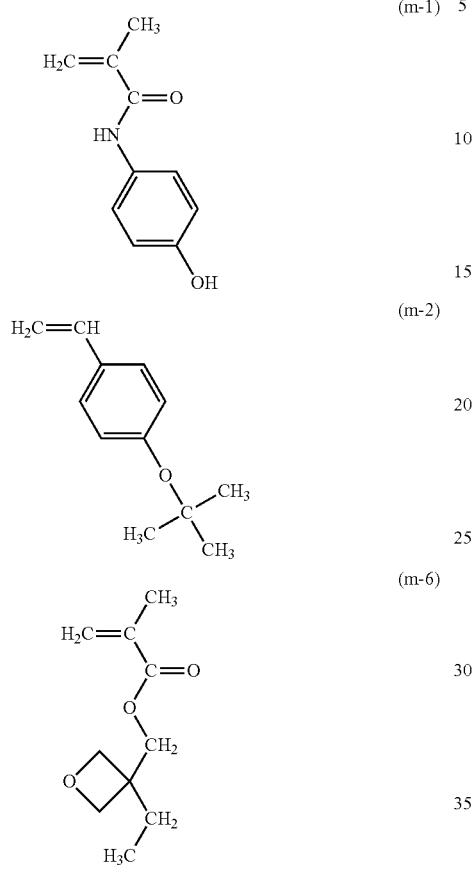

Synthesis Example 12

Polymer (B-7)

26.55 g of (m-1), 4.40 g of (m-2), 13.05 g of (m-3), 6.00 g of the monomer shown by the following formula (m-7) (hereinafter referred to as "(m-7)"), and 3.28 g of AIBN were dissolved in 150 g of IPA. The monomers were polymerized under reflux conditions (82° C.) for six hours. After cooling the reaction vessel with running water, 100 g of ethyl acetate, 70 g of IPA, and 70 g of methanol were added to the polymer solution to obtain a homogenous solution. After the addition of 300 g of water, the mixture was allowed to stand for one hour. A viscous polymer that had precipitated in the lower layer was collected, and dried at 50° C. under vacuum to obtain a polymer (B-7) (yield: 60%). The polymer (B-7) had an Mw of 8000 and a dispersity (Mw/Mn) of 1.56. As a result of $^{13}$C-NMR analysis, the content (mol %) ratio of the repeating units in the polymer (B-7) was (m-1)/(m-2)/(m-3)/(m-7) =55.2/12.8/20.8/11.2. The polymer (B-7) is referred to as "resin (B-7)".

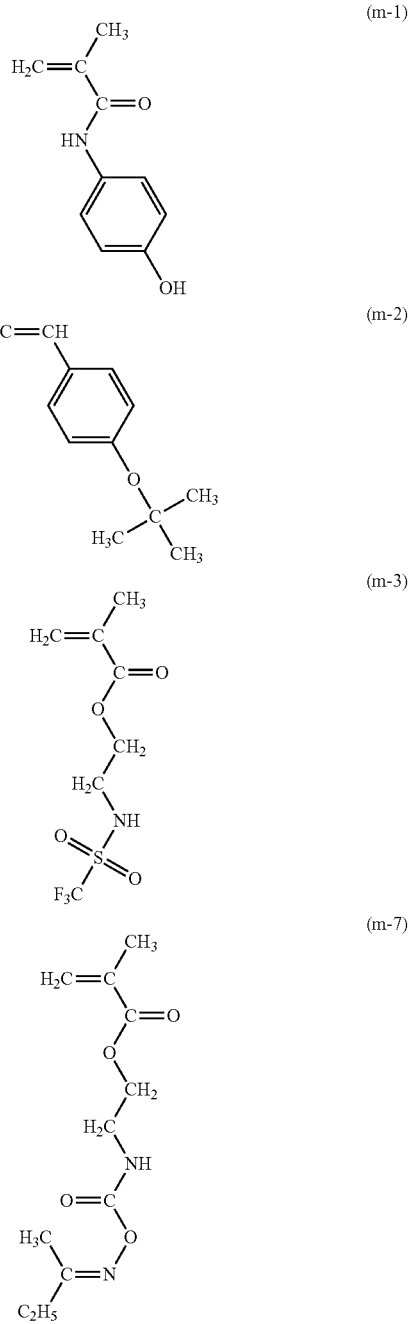

Example 1

A mixture of 100 parts of the resin (B-1), 30 parts of a crosslinkable component (C-1), and 2620 parts of a solvent (F-3) was stirred for three hours, and filtered through a filter having a pore size of 0.03 um to obtain an insolubilizing resin composition (A).

Examples 2 to 13

Insolubilizing resin compositions (B) to (M) were prepared in the same manner as in Example 1, except for changing the composition as shown in Table 2.

TABLE 2

| Insolubilizing resin composition | Resin Type | Amount (parts) | Crosslinkable component Type | Amount (parts) | Solvent Type | Amount (parts) |
|---|---|---|---|---|---|---|
| Example 1 | A | B-1 | 100 | C-1 | 30 | F-3 | 2620 |
| Example 2 | B | B-1 | 100 | C-2 | 30 | F-3 | 2620 |
| Example 3 | C | B-1 | 100 | C-3 | 30 | F-3 | 2620 |
| Example 4 | D | B-5 | 100 | C-1 | 30 | F-3 | 2620 |
| Example 5 | E | B-5 | 100 | C-1 | 5 | F-3 | 524 |
|  |  |  |  | C-3 | 30 | F-4 | 2096 |
| Example 6 | F | B-1 | 100 | C-1 | 5 | F-3 | 524 |
|  |  |  |  | C-4 | 30 | F-4 | 2096 |
| Example 7 | G | B-2 | 100 | C-1 | 5 | F-3 | 524 |
|  |  |  |  | C-3 | 30 | F-4 | 2096 |
| Example 8 | H | B-3 | 100 | C-1 | 5 | F-3 | 524 |
|  |  |  |  | C-4 | 30 | F-4 | 2096 |
| Example 9 | I | B-4 | 100 | C-1 | 5 | F-3 | 524 |
|  |  |  |  | C-3 | 30 | F-4 | 2096 |
| Example 10 | J | B-5 | 100 | C-1 | 5 | F-3 | 524 |
|  |  |  |  | C-4 | 30 | F-4 | 2096 |
| Example 11 | K | B-6 | 100 | C-1 | 5 | F-3 | 524 |
|  |  |  |  | C-3 | 30 | F-4 | 2096 |
| Example 12 | L | B-6 | 100 | C-1 | 5 | F-3 | 524 |
|  |  |  |  | C-4 | 30 | F-4 | 2096 |
| Example 13 | M | B-7 | 100 | C-1 | 5 | F-3 | 524 |
|  |  |  |  | C-3 | 30 | F-4 | 2096 |

The crosslinkable component and the solvent shown in Table 2 are as follows.
(Crosslinkable component)
C-1: Nikalac MX-750 (manufactured by Nippon Carbide Industries Co., Inc.)
C-2: pentaerythritol tetracrylate
C-3: OXIPA (manufactured by Ube Industries, Ltd.)
C-4: pentaerythritol triacrylate
(Solvent)
F-3: 1-butanol
F-4: 4-methyl-2-pentanol Reference Example 1

A lower-layer antireflective film composition ("ARC29A" manufactured by Brewer Science) was spin-coated onto a 12-inch silicon wafer using a coater/developer "CLEAN TRACK ACT12" (manufactured by Tokyo Electron Ltd.), and prebaked (PB) (205° C., 60 sec) to form a film (thickness: 77 nm). The first resist material (1) was spin-coated onto the film using the coater/developer "CLEAN TRACK ACT12", prebaked (PB) (115° C., 60 sec), and cooled (23° C., 30 sec) to obtain a coating film (thickness: 150 nm). The coating film was exposed through a mask (50 nm line/200 nm pitch) using an ArF liquid immersion lithography system ("XT1250i" manufactured by ASML) (NA: 0.85, Outer/Inner=0.89/0.59, Annular). The coating film was subjected to PEB (115° C., 60 sec) on the hot plate of the coater/developer "CLEAN TRACK ACT12", cooled (23° C., 30 sec), subjected to paddle development (30 sec) using a 2.38% tetramethylammonium hydroxide aqueous solution (using the GP nozzle of the development cup), and rinsed with ultrapure water. The wafer was spin-dried at 2000 rpm for 15 seconds to obtain an evaluation substrate A on which a first resist pattern was formed.

The insolubilizing resin composition (A) prepared in Example 1 was spin-coated onto the first resist pattern formed on the evaluation substrate A to a thickness of 150 nm using the coater/developer "CLEAN TRACK ACT12", and prebaked (PB) (130° C., 60 sec). The film was cooled on a cooling plate (23° C., 30 sec) using the coater/developer "CLEAN TRACK ACT12", subjected to paddle development (60 sec) using a 2.38% tetramethylammonium hydroxide aqueous solution (using the GP nozzle of the development cup), and rinsed with ultrapure water. The substrate was spin-dried at 2000 rpm for 15 seconds, and prebaked (PB) (165° C., 90 sec) to obtain an evaluation substrate B on which an insolubilized resist pattern was formed.

Reference Examples 2 to 20

An evaluation substrate B on which an insolubilized resist pattern was formed was obtained in the same manner as in Reference Example 1, except for using the first resist material and the insolubilizing resin composition shown in Tables 3-1 and 3-2, and employing the conditions shown in Tables 3-1 and 3-2.

Reference Examples 21 to 23

An evaluation substrate B was obtained in the same manner as in Reference Example 1, except for using the first resist material shown in Tables 3-1 and 3-2 without using the insolubilizing resin composition, and omitting the process for the insolubilizing resin composition shown in Tables 3-1 and 3-2.

TABLE 3-1

| | First resist material | Evaluation substrate A | | | | Evaluation substrate B | | | | | |
|---|---|---|---|---|---|---|---|---|---|---|---|
| | | PB conditions | | PEB conditions | | Insolubilizing resin composition | Before washing | | After washing | | |
| | | Temp. (° C.) | Time (s) | Temp. (° C.) | Time (s) | | Temp. (° C.) or UV-curing | Time (s) | Temp. (° C.) or UV-curing | Time (s) | Type | Evaluation of pattern |

| | First resist material | Temp. (° C.) | Time (s) | Temp. (° C.) | Time (s) | Insolubilizing resin composition | Temp. (° C.) or UV-curing | Time (s) | Temp. (° C.) or UV-curing | Time (s) | Type | Evaluation of pattern |
|---|---|---|---|---|---|---|---|---|---|---|---|---|
| Reference Example 1 | 1 | 115 | 60 | 115 | 60 | A | 130 | 60 | 165 | 90 | 1 | Good |
| Reference Example 2 | 2 | 120 | 60 | 115 | 60 | A | 130 | 60 | 165 | 90 | 2 | Good |
| Reference Example 3 | 3 | 120 | 60 | 130 | 60 | A | 130 | 60 | 165 | 90 | 3 | Good |
| Reference Example 4 | 4 | 100 | 60 | 110 | 60 | A | 130 | 60 | 165 | 90 | 4 | Good |
| Reference Example 5 | 5 | 115 | 60 | 110 | 60 | A | 130 | 60 | 165 | 90 | 5 | Good |
| Reference Example 6 | 6 | 115 | 60 | 105 | 60 | A | 130 | 60 | 165 | 90 | 6 | Good |
| Reference Example 7 | 7 | 115 | 60 | 110 | 60 | A | 130 | 60 | 165 | 90 | 7 | Good |
| Reference Example 8 | 2 | 120 | 60 | 115 | 60 | A | 155 | 60 | — | — | 8 | Good |
| Reference Example 9 | 2 | 120 | 60 | 115 | 60 | B | 130 | 60 | 165 | 90 | 9 | Good |
| Reference Example 10 | 2 | 120 | 60 | 115 | 60 | C | 130 | 60 | 165 | 90 | 10 | Good |
| Reference Example 11 | 2 | 120 | 60 | 115 | 60 | D | 130 | 60 | 165 | 90 | 11 | Good |
| Reference Example 12 | 2 | 120 | 60 | 115 | 60 | E | 130 | 60 | 165 | 90 | 12 | Good |
| Reference Example 13 | 2 | 120 | 60 | 115 | 60 | F | 130 | 60 | 165 | 90 | 13 | Good |

TABLE 3-2

| | First resist material | Temp. (° C.) | Time (s) | Temp. (° C.) | Time (s) | Insolubilizing resin composition | Temp. (° C.) or UV-curing | Time (s) | Temp. (° C.) or UV-curing | Time (s) | Type | Evaluation of pattern |
|---|---|---|---|---|---|---|---|---|---|---|---|---|
| Reference Example 14 | 2 | 120 | 60 | 115 | 60 | G | 130 | 60 | 165 | 90 | 14 | Good |
| Reference Example 15 | 2 | 120 | 60 | 115 | 60 | H | 130 | 60 | 165 | 90 | 15 | Good |
| Reference Example 16 | 2 | 120 | 60 | 115 | 60 | I | 130 | 60 | 165 | 90 | 16 | Good |
| Reference Example 17 | 2 | 120 | 60 | 115 | 60 | J | $Xe_2$ (172 nm) | 60 | — | — | 17 | Good |
| Reference Example 18 | 2 | 120 | 60 | 115 | 60 | K | 130 | 90 | $Xe_2$ (172 nm) | 60 | 18 | Good |
| Reference Example 19 | 2 | 120 | 60 | 115 | 60 | L | $Xe_2$ (172 nm) | 60 | — | — | 19 | Good |
| Reference Example 20 | 2 | 120 | 60 | 115 | 60 | M | 130 | 90 | $Xe_2$ (172 nm) | 60 | 20 | Good |
| Reference Example 21 | 1 | 120 | 60 | 115 | 60 | — | — | — | — | — | 21 | Good |
| Reference Example 22 | 2 | 120 | 60 | 115 | 60 | — | — | — | — | — | 22 | Good |
| Reference Example 23 | 3 | 120 | 60 | 115 | 60 | — | — | — | — | — | 23 | Good |

Example 14

The second resist material (8) was spin-coated onto the evaluation substrate B(1) obtained in Reference Example 1 using the coater/developer "CLEAN TRACK ACT12", pre-baked (PB) (100° C., 60 sec), and cooled (23° C., 30 sec) to obtain a coating film (thickness: 150 nm). The space area of the insolubilized resist pattern was exposed through a mask (50 nm line/200 nm pitch) using the ArF liquid immersion lithography system (NA: 0.85, Outer/Inner=0.89/0.59, Annular). The coating film was subjected to PEB (95° C., 60 sec) on the hot plate of the coater/developer "CLEAN TRACK ACT12", cooled (23° C., 30 sec), subjected to paddle development (30 sec) using a 2.38% tetramethylammonium hydroxide aqueous solution (using the GP nozzle of the development cup), and rinsed with ultrapure water. The substrate was spin-dried at 2000 rpm for 15 seconds to obtain an evaluation substrate C on which a second resist pattern was formed. The pattern formed on the evaluation substrate C was evaluated as "Good", and a change in CD was evaluated as "Good".

Examples 15 to 28

An evaluation substrate C on which a second resist pattern was formed was obtained in the same manner as in Example 14, except for using one of the evaluation substrates B obtained in Reference Examples 2 to 20 and the second resist material shown in Table 4, and employing the conditions shown in Table 4. The evaluation results for the pattern formed on the resulting evaluation substrate C and the evaluation results for a change in CD are shown in Table 4.

Comparative Example 1

An evaluation substrate C was obtained in the same manner as in Example 14, except for using the evaluation substrate B(21) obtained in Reference Example 21, and forming the second resist pattern on the first resist pattern under the conditions shown in Table 4. The evaluation results for the pattern formed on the resulting evaluation substrate C and the evaluation results for a change in CD are shown in Table 4.

Comparative Example 2

An evaluation substrate C was obtained in the same manner as in Example 14, except for using the evaluation substrate B(22) obtained in Reference Example 22, and forming the second resist pattern on the first resist pattern under the conditions shown in Table 4. The evaluation results for the pattern formed on the resulting evaluation substrate C and the evaluation results for a change in CD are shown in Table 4.

Comparative Example 3

An evaluation substrate C was obtained in the same manner as in Example 14, except for using the evaluation substrate B(23) obtained in Reference Example 23, and forming the second resist pattern on the first resist pattern under the conditions shown in Table 4. The evaluation results for the pattern formed on the resulting evaluation substrate C and the evaluation results for a change in CD are shown in Table 4.

TABLE 4

| | | | Evaluation substrate C | | | | | |
|---|---|---|---|---|---|---|---|---|
| | Evaluation substrate B | Second resist material | PB conditions | | PEB conditions | | Evaluation of pattern | Evaluation of change in CD |
| | | | Temp. (° C.) | Time (s) | Temp. (° C.) | Time (s) | | |
| Example 14 | 1 | 8 | 100 | 60 | 95 | 60 | Good | Good |
| Example 15 | 2 | 9 | 100 | 60 | 95 | 60 | Good | Good |
| Example 16 | 3 | 10 | 100 | 60 | 95 | 60 | Good | Good |
| Example 17 | 9 | 11 | 100 | 60 | 95 | 60 | Good | Good |
| Example 18 | 10 | 12 | 100 | 60 | 95 | 60 | Good | Good |
| Example 19 | 11 | 8 | 100 | 60 | 95 | 60 | Good | Good |
| Example 20 | 12 | 8 | 100 | 60 | 95 | 60 | Good | Excellent |
| Example 21 | 13 | 8 | 100 | 60 | 95 | 60 | Good | Excellent |
| Example 22 | 14 | 8 | 100 | 60 | 95 | 60 | Good | Excellent |
| Example 23 | 15 | 8 | 100 | 60 | 95 | 60 | Good | Excellent |
| Example 24 | 16 | 9 | 100 | 60 | 95 | 60 | Good | Excellent |
| Example 25 | 5 | 9 | 100 | 60 | 95 | 60 | Good | Good |
| Example 26 | 18 | 9 | 100 | 60 | 95 | 60 | Good (hole) | Good |
| Example 27 | 6 | 9 | 100 | 60 | 95 | 60 | Good (hole) | Good |
| Example 28 | 20 | 9 | 100 | 60 | 95 | 60 | Good (hole) | Good |
| Comparative Example 1 | 21 | 1[*1] | 130 | 60 | 95 | 60 | Bad | Bad |
| Comparative Example 2 | 22 | 8 | 130 | 60 | 95 | 60 | Bad | Bad |
| Comparative Example 3 | 23 | 9 | 130 | 60 | 95 | 60 | Bad | Bad |

[*1]First resist material

As shown in Table 4, a change in line width when forming a pattern could be suppressed when using the resist pattern-insolubilizing resin composition according to the embodiment of the invention.

The above resist pattern-forming method can effectively and accurately reduce the space of the resist pattern, and can advantageously and economically form a pattern that exceeds the wavelength limit. Therefore, the above resist pattern-forming method may suitably be used in the field of microfabrication such as production of integrated circuit devices that are expected to be further scaled down in the future.

According to the embodiment of the present invention, the above resist pattern-insolubilizing resin composition can suppress a change in line width of the first-layer pattern.

According to the embodiment of the present invention, the above resist pattern-forming method can conveniently and efficiently form a fine resist pattern.

Obviously, numerous modifications and variations of the present invention are possible in light of the above teachings. It is therefore to be understood that within the scope of the appended claims, the invention may be practiced otherwise than as specifically described herein.

The invention claimed is:

1. A resist pattern-insolubilizing resin composition used in a resist pattern-forming method and comprising:
   a solvent comprising at least two kinds of alcohols and having a water content of 10 mass % or less; and
   a resin comprising:
   a first repeating unit that includes a hydroxyl group in a side chain thereof;
   a second repeating unit which is at least one of a repeating unit derived from a monomer shown by formula (1-1) or a repeating unit derived from a monomer shown by formula (1-2); and
   a third repeating unit derived from a monomer shown by formula (3),
   a content of the first repeating unit in the resin being from 30 to 90 mol % based on a total of repeating units in the resin, a content of the second repeating unit in the resin being from 5 to 60 mol % based on the total of repeating units in the resin, a content of the third repeating unit in the resin being from 5 to 65 mol % based on the total of repeating units in the resin,

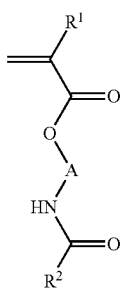
(1-1)

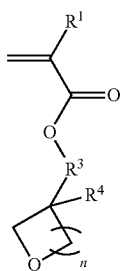
(1-2)

wherein $R^1$ represents a hydrogen atom, a methyl group, or a trifluoromethyl group, A represents a methylene group, an ethylene group, or a propylene group, $R^2$ represents a group shown by formula (2-1) or a group shown by formula (2-2), $R^3$ represents a methylene group or an alkylene group having 2 to 6 carbon atoms, $R^4$ represents a hydrogen atom, a methyl group, or an ethyl group, and n is 0 or 1,

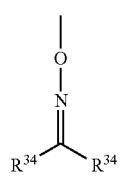
(2-1)

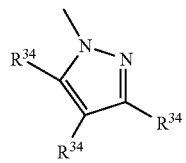
(2-2)

wherein each $R^{34}$ individually represents a hydrogen atom or a linear or branched alkyl group having 1 to 10 carbon atoms,

(3)

wherein $R^5$ represents a hydrogen atom, a linear or branched alkyl group having 1 to 8 carbon atoms, or a linear or branched alkoxy group having 1 to 8 carbon atoms.

2. The resist pattern-insolubilizing resin composition according to claim 1, wherein the first repeating unit comprises at least one of a repeating unit derived from hydroxyacrylanilide or a repeating unit derived from hydroxymethacrylanilide.

3. The resist pattern-insolubilizing resin composition according to claim 1, wherein the water content of the solvent is 3 mass % or less.

4. The resist pattern-insolubilizing resin composition according to claim 1, wherein the first repeating unit is derived from a monomer shown by formula (4):

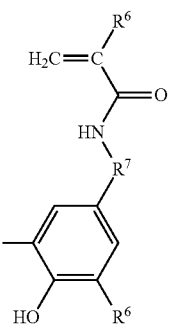
(4)

wherein each $R^6$ individually represents a hydrogen atom or a methyl group, and $R^7$ represents a single bond or a linear, branched, or cyclic divalent hydrocarbon group.

5. The resist pattern-insolubilizing resin composition according to claim 1, wherein $R^5$ in formula (3) represents a t-butyl group, an acetoxy group, or a 1-ethoxyethoxy group.

6. The resist pattern-insolubilizing resin composition according to claim 1, wherein the third repeating unit is derived from a styrene derivative that comprises a functional group that is capable of being converted into a phenolic hydroxyl group after copolymerization.

7. A resist pattern-forming method comprising:
   providing a first positive-tone radiation-sensitive resin composition on a substrate to form a first resist layer on the substrate;

selectively exposing the first resist layer through a mask;
developing the first resist layer to form a first resist pattern;
applying the resist pattern-insolubilizing resin composition according to claim 1 to the first resist pattern;
baking or UV-curing the resist pattern-insolubilizing resin composition;
washing the resist pattern-insolubilizing resin composition to form an insolubilized resist pattern that is insoluble in a developer and a second positive-tone radiation-sensitive resin composition;
providing the second positive-tone radiation-sensitive resin composition on the substrate to form a second resist layer on the substrate on which the insolubilized resist pattern is formed;
selectively exposing the second resist layer through a mask, and
developing the second resist layer to form a second resist pattern.

8. A resist pattern-forming method comprising:
providing a first positive-tone radiation-sensitive resin composition on a substrate to form a first resist layer on the substrate;
selectively exposing the first resist layer through a mask;
developing the first resist layer to form a first resist pattern;
applying the resist pattern-insolubilizing resin composition according to claim 2 to the first resist pattern;
baking or UV-curing the resist pattern-insolubilizing resin composition;
washing the resist pattern-insolubilizing resin composition to form an insolubilized resist pattern that is insoluble in a developer and a second positive-tone radiation-sensitive resin composition;
providing the second positive-tone radiation-sensitive resin composition on the substrate to form a second resist layer on the substrate on which the insolubilized resist pattern is formed;
selectively exposing the second resist layer through a mask, and
developing the second resist layer to form a second resist pattern.

9. The resist pattern-forming method according to claim 7, wherein the water content of the solvent is 3 mass % or less.

10. The resist pattern-forming method according to claim 7, wherein the first repeating unit is derived from a monomer shown by formula (4):

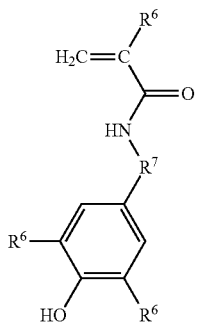

(4)

wherein each $R^6$ individually represents a hydrogen atom or a methyl group, and $R^7$ represents a single bond or a linear, branched, or cyclic divalent hydrocarbon group.

11. The resist pattern-forming method according to claim 7, wherein $R^5$ in formula (3) represents a t-butyl group, an acetoxy group, or a 1-ethoxyethoxy group.

12. The resist pattern-forming method according to claim 7, wherein the third repeating unit is derived from a styrene derivative that comprises a functional group that is capable of being converted into a phenolic hydroxyl group after copolymerization.

* * * * *